(12) United States Patent
Pushkarsky et al.

(10) Patent No.: US 8,306,077 B2
(45) Date of Patent: Nov. 6, 2012

(54) HIGH OUTPUT, MID INFRARED LASER SOURCE ASSEMBLY

(75) Inventors: Michael Pushkarsky, San Diego, CA (US); Timothy Day, Poway, CA (US); David F. Arnone, Mountain View, CA (US)

(73) Assignee: Daylight Solutions, Inc., San Diego, CA (US)

( * ) Notice: Subject to any disclaimer, the term of this patent is extended or adjusted under 35 U.S.C. 154(b) by 241 days.

(21) Appl. No.: 12/427,364

(22) Filed: Apr. 21, 2009

(65) Prior Publication Data

US 2010/0111122 A1 May 6, 2010

Related U.S. Application Data

(60) Provisional application No. 61/048,764, filed on Apr. 29, 2008.

(51) Int. Cl.
*H01S 3/13* (2006.01)
(52) U.S. Cl. ......................................................... 372/32
(58) Field of Classification Search ...................... 372/32
See application file for complete search history.

(56) References Cited

U.S. PATENT DOCUMENTS

| | | | |
|---|---|---|---|
| 4,555,627 A | 11/1985 | McRae, Jr. | |
| 4,745,276 A | 5/1988 | Broicher et al. | |
| 4,772,789 A | 9/1988 | Maram et al. | |
| 4,871,916 A | 10/1989 | Scott | |
| 4,978,197 A * | 12/1990 | Horikawa | 359/629 |
| 5,082,799 A | 1/1992 | Holmstrom et al. | |

(Continued)

FOREIGN PATENT DOCUMENTS

EP 2113975 A2 11/2009

(Continued)

OTHER PUBLICATIONS

Stephen A. Holloway, "Evolution of test and evaluation of infrared missile warning systems," Sep. 19, 2007, pp. 67370L-1-67370L-12, Proc. of SPIE vol. 6737 67370102, XP002616657, Downloaded from SPIE Digital Library on Jan. 13, 2011, http://spiedl.org/term.*

(Continued)

*Primary Examiner* — Patrick Stafford
(74) *Attorney, Agent, or Firm* — Roeder & Broder LLP

(57) ABSTRACT

A laser source assembly (10) for providing an assembly output beam (12) includes a first MIR laser source (352A), a second MIR laser source (352B), and a beam combiner (244). The first MIR laser source (352A) emits a first MIR beam (356A) that is in the MIR range and the second MIR laser source (352B) emits a second MIR beam (356B) that is in the MIR range. Further, the beam combiner (244) spatially combines the first MIR beam (356A) and the second MIR beam (356B) to provide the assembly output beam (12). With this design, a plurality MIR laser sources (352A) (352B) can be packaged in a portable, common module, each of the MIR laser sources (352A) (352B) generates a narrow linewidth, accurately settable MIR beam (356A) (356B), and the MIR beams (356A) (356B) are combined to create a multiple watt assembly output beam (12) having the desired power. The beam combiner (244) can includes a combiner lens (364) and an output optical fiber (366). In this embodiment, the MIR beams (356A) (356B) are directed at the combiner lens (364) and the combiner lens (364) focuses the MIR beams (356A) (356B) onto a fiber facet (366A) of the output optical fiber (366). Moreover, the output optical fiber (366) can include an AR coating (366B) on the fiber facet (366A).

40 Claims, 7 Drawing Sheets

U.S. PATENT DOCUMENTS

| | | | |
|---|---|---|---|
| 5,161,408 | A | 11/1992 | McRae et al. |
| 5,172,390 | A | 12/1992 | Mooradian |
| 5,181,214 | A | 1/1993 | Berger et al. |
| 5,225,679 | A | 7/1993 | Clarke et al. |
| 5,255,073 | A | 10/1993 | Wallin et al. |
| 5,264,368 | A | 11/1993 | Clarke et al. |
| 5,315,436 | A | 5/1994 | Lowenhar et al. |
| 5,430,293 | A | 7/1995 | Sato et al. |
| 5,523,569 | A | 6/1996 | Hornfeld et al. |
| 5,656,813 | A | 8/1997 | Moore et al. |
| 5,780,724 | A | 7/1998 | Olender et al. |
| 5,824,884 | A | 10/1998 | Olender et al. |
| 5,834,632 | A | 11/1998 | Olender et al. |
| 5,854,422 | A | 12/1998 | McKeon et al. |
| 5,866,073 | A | 2/1999 | Sausa et al. |
| 6,089,076 | A | 7/2000 | Mueller et al. |
| 6,154,307 | A | 11/2000 | Veronesi et al. |
| 6,157,033 | A | 12/2000 | Chudnovsky |
| 6,326,646 | B1 | 12/2001 | Baillargeon |
| 6,327,896 | B1 | 12/2001 | Veronesi et al. |
| 6,470,036 | B1 | 10/2002 | Bailey et al. |
| 6,553,045 | B2 | 4/2003 | Kaspi |
| 6,575,641 | B2 | 6/2003 | Yamabayashi et al. |
| 6,636,539 | B2 | 10/2003 | Martinsen |
| 6,690,472 | B2 | 2/2004 | Kulp et al. |
| 6,803,577 | B2 | 10/2004 | Edner et al. |
| 6,859,481 | B2 | 2/2005 | Zheng |
| 6,866,089 | B2 | 3/2005 | Avila |
| 6,885,965 | B2 | 4/2005 | Butler et al. |
| 6,995,846 | B2 | 2/2006 | Kalayeh et al. |
| 7,032,431 | B2 | 4/2006 | Baum et al. |
| 7,061,022 | B1 | 6/2006 | Pham et al. |
| 7,151,787 | B2 | 12/2006 | Kulp et al. |
| 7,189,970 | B2 | 3/2007 | Racca et al. |
| 7,424,042 | B2 | 9/2008 | Day et al. |
| 7,466,734 | B1 | 12/2008 | Day et al. |
| 7,492,806 | B2 | 2/2009 | Day et al. |
| 7,535,656 | B2 | 5/2009 | Day et al. |
| 7,535,936 | B2 | 5/2009 | Day et al. |
| 2002/0153497 | A1* | 10/2002 | Pepper et al. ............ 250/495.1 |
| 2002/0176473 | A1 | 11/2002 | Mooradian |
| 2003/0043877 | A1 | 3/2003 | Kaspi |
| 2004/0013154 | A1 | 1/2004 | Zheng |
| 2004/0032891 | A1 | 2/2004 | Ikeda et al. |
| 2004/0091013 | A1* | 5/2004 | Yamaguchi et al. ......... 372/108 |
| 2004/0228371 | A1 | 11/2004 | Kolodzey et al. |
| 2004/0238811 | A1 | 12/2004 | Nakamura et al. |
| 2005/0083568 | A1 | 4/2005 | Nakae et al. |
| 2005/0213627 | A1 | 9/2005 | Masselink et al. |
| 2006/0056466 | A1 | 3/2006 | Belenky et al. |
| 2006/0262316 | A1 | 11/2006 | Baney |
| 2007/0019702 | A1 | 1/2007 | Day et al. |
| 2007/0030865 | A1 | 2/2007 | Day et al. |
| 2007/0291804 | A1 | 12/2007 | Day et al. |
| 2008/0019010 | A1* | 1/2008 | Govorkov et al. ............ 359/641 |
| 2008/0231719 | A1 | 9/2008 | Benson et al. |
| 2008/0298406 | A1 | 12/2008 | Day et al. |
| 2008/0304524 | A1 | 12/2008 | Marsland et al. |

FOREIGN PATENT DOCUMENTS

| | | |
|---|---|---|
| JP | 58072108 | 4/1983 |
| JP | 3048480 A | 3/1991 |
| JP | 2005317819 A | 11/2005 |
| WO | WO9220127 A1 | 11/1992 |
| WO | WO93/21843 A1 | 11/1993 |
| WO | WO 9321843 A1 * | 11/1993 |
| WO | WO2006045303 A2 | 5/2006 |
| WO | WO2008/010966 A2 | 1/2008 |
| WO | WO2008036881 A2 | 3/2008 |
| WO | WO2008036884 A2 | 3/2008 |

OTHER PUBLICATIONS

Viper™ Mid-IR Laser, Multi-Band Laser Capability, Northrop Grumman, Copyright © 2009, http://www.es.northropgrumman.com/solutions/viperlaser/.

Extended Search Report for European Patent Application No. 09158585.1, dated Jan. 28, 2011, Daylight Solutions, Inc.

Stephen A. Holloway, "Evolution of test and evaluation of infrared missile warning systems," Sep. 19, 2007, pp. 6737OL-1-6737OL-12, Proc. of SPIE vol. 6737 67370102, XP002616657, Downloaded from SPIE Digital Library on Jan. 13, 2011, http://spiedl.org/terms.

Hildebrandt, L.et al.."Quantum cascade external cavity laser systems in the mid-infrared spectral range," 2004, Sacher Lasertechnik Group, Marburg, Germany.

Haim Lotem, Mode-hop suppression of Littrow grating-tuned lasers: comment, 20 Month 1994, p. 1, vol. 33, No. 00, Applied Optics.

Patrick McNicholl and Harold J. Metcalf, Synchronous cavity mode and feedback wavelength scanning in dye laser oscillators with gratings, Sep. 1, 1985, pp. 2757-2761, vol. 24, No. 17, Applied Optics, © 1985 Optical Society of America.

Corrie David Farmer, "Fab and Eval. of QCL's", Sep. 2000, Faculty of Engineering, University of Glasgow, Glasgow, UK.

M. De Labachelerie and G. Passedat, Mode-hop suppression of Littrow grating-tuned lasers, Jan. 20, 1993, pp. 269-272vol. 32, No. 3, Applied Optics, © 1993 Optical Society of America.

S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland.

Gaetano Scamarcio, Mid-IR and THz Quantum Cascade Lasers, 2005, Physics Dept., University of Bari, Bari Italy.

Gaetano Scamarcio et al., Micro-probe characterization of QCLs correlation with optical performance, APL 78, 1177 & APL 78, 2095 (2001), APL 2002, APL 2004, University of Bari, Bari Italy.

J. Faist, THz and Mid-IR Quantum cascade lasers, QM in space, Chatillon, Mar. 31, Science 2002, University of Neuchatel, EU Projects ANSWER/TERANOVA; Agilent, Funding Swiss National Science Foundation.

Joel M. Hensley, Recent Updates in QCL-based Sensing Applications, Sep. 5-10, 2006, Physical Sciences, Inc., Andover, MA, 2nd International Workshop on Quantum Cascade Lasers, Ostuni, Italy.

J.M. Hensley et al., Demonstration of an External Cavity Terahertz Quantum Cascade Laser, Copyright 2005, Optical Society of America, Washington, DC 20036.

L. Hildebrandt et al., Quantum cascade external cavity and DFB laser systems in the mid-infrared spectral range: devices and applications, 2004, Marburg Germany.

Richard Maulini et al., Broadly tunable external cavity quantum-cascade lasers, 2005, University of Neuchatel, Neuchatel Switzerland.

Tsekoun, A. et al; "Improved performance of QCL's through a scalable, manufacturable epitaxial-side-down mounting process"; Feb. 2006.

Pushkarsky, M. et al.; "Sub-parts-per-billion level detection of NO2 using room temp. QCLs"; May 2006.

Wirtz, D. et al.; "A tuneable heterodyne infrared spectrometer"; Physikalisches Institut; University of Koln; Koln Germany Spectrochimica 2002.

Williams, B. et al.;"Terahertz QCLs and Electronics"; PhD-MIT 2003.

Response to Extended Search Report for European Patent Application No. 09158585.1, as filed on Jul. 28, 2011, Daylight Solutions, Inc.

PCT Notification of Transmittal of International Search Report and Written Opinion for PCT Application No. PCT/US2011/043065 as mailed on Sep. 26, 2011, Daylight Solutions, Inc.

Oleksiy Andrusyak et al., External and common-cavity high spectral density beam combining of high power fiber lasers, Jan. 1, 2008, Proc. of SPIE vol. 6873, SPIE Digital Library.

Thomas Schreiber et al., Incoherent Beam Combining of Continuous-Wave and Pulsed Yb-Doped Fiber Amplifiers, Mar. 1, 2009, vol. 15, No. 2, © 2009 IEEE.

Response to European Patent Office Communication as filed on Feb. 29, 2012 for European Patent Application No. 09158585.1, Daylight Solutions, Inc.

European Patent Office Communication pursuant to Article 94(3) EPC dated Sep. 2, 2011 for European Patent Application No. 09158585.1, Daylight Solutions, Inc.

* cited by examiner

US 8,306,077 B2

HIGH OUTPUT, MID INFRARED LASER SOURCE ASSEMBLY

RELATED INVENTIONS

This application claims priority on U.S. Provisional Application Ser. No. 61/048,764, filed Apr. 29, 2008 and entitled "LASER SOURCE". As far as is permitted, the contents of U.S. Provisional Application Ser. No. 61/048,764 are incorporated herein by reference.

BACKGROUND

Mid Infrared ("MIR") laser sources that produce a fixed wavelength output beam can be used in many fields such as, in medical diagnostics, pollution monitoring, leak detection, analytical instruments, homeland security and industrial process control. Recently, lasers have been used to protect aircraft from sophisticated heat-seeking missiles. Unfortunately, existing portable, compact MIR laser sources do not generate an output beam having sufficient power, a narrow linewidth, and an accurately tunable wavelength.

SUMMARY

The present invention is directed to a laser source assembly for providing an assembly output beam. In one embodiment, the laser source assembly includes a first MIR laser source, a second MIR laser source, and a beam combiner. The first MIR laser source emits a first MIR beam that is in the MIR range, and the second MIR laser source emits a second MIR beam that is in the MIR range. Further, the beam combiner spatially combines the first MIR beam and the second MIR beam to provide the assembly output beam. With this design, a plurality MIR laser sources can be packaged in a portable, common module, each of the MIR laser sources generates a narrow linewidth, accurately settable MIR beam, and the MIR beams are combined to create a multiple watt assembly output beam having the desired power.

As used herein, to be classified as a MIR laser source, the MIR beam of the MIR laser source has a wavelength in the range of approximately 3-14 microns. Stated in another fashion, as used herein, the MIR range is approximately 3-14 microns.

Further, as used herein, the term "combines" shall mean (i) that the beams are directed parallel to each other (e.g. travel along parallel axes), and (ii) that the beams are fully overlapping, partly overlapping, or are adjacent to each other.

In one embodiment, the beam combiner includes a combiner lens and an output optical fiber. In this embodiment, the first MIR beam and the second MIR beam are directed at the combiner lens and the combiner lens focuses the MIR beams onto a fiber facet of the output optical fiber. Further, in this embodiment, the output optical fiber includes an AR coating on the fiber facet. The AR coating improves the ability of the output optical fiber to receive the MIR beams, and inhibits the generation of heat at the fiber facet. This improves the efficiency of the system and improves the durability of the output optical fiber.

Alternatively, for example, the beam combiner can be designed without the output optical fiber. In this embodiment, the assembly output beam from the combiner lens can be directed at an optical device. Still alternatively, the beam combiner can be designed without both the combiner lens and the output optical fiber. In this design, the assembly output beam is directed into free space at a target or another optical device.

As provided herein, each of the MIR laser sources can be individually tuned so that a specific wavelength of the MIR beams of one or more of the MIR laser sources is the same or different. For example, the first MIR beam can be at a first wavelength and the second MIR beam can be at a second wavelength, and the first wavelength can be approximately equal to the second wavelength. With this design, the MIR laser sources can be tuned so that the assembly output beam is primarily a single wavelength beam.

Alternatively, the first wavelength can be different than the second wavelength. With this design, the MIR laser sources can be tuned so that the assembly output beam is primarily a multiple wavelength (incoherent) beam.

Further, the power output of the assembly output beam can be adjusted by changing the number of MIR laser sources. As a result thereof, the characteristics of the assembly output beam can be adjusted to suit the application requirements for the laser source assembly.

Additionally, the laser source assembly can include a non-MIR laser source that emits a non-MIR beam that is outside of the MIR range. In this embodiment, the beam combiner combines the MIR beams and the non-MIR beam to provide the assembly output beam. In this embodiment, the assembly output beam is a multiple band beam.

Moreover, the laser source assembly can include a mounting base that retains the plurality of laser sources and a thermal module for controlling the temperature of the mounting base. With this design, the single mounting base can be used in conjunction with the thermal module to accurately control the temperature and position of the laser sources.

In certain embodiments, each MIR laser source has a similar design, and each MIR laser source includes (i) a QC gain media that generates a beam in the MIR range, (ii) a WD feedback assembly that can be tuned to select the desired wavelength of the MIR beam, (iii) a temperature controller that controls the temperature of the QC gain media, and (iv) a cavity optical assembly positioned between the QC gain media and the WD feedback assembly. With this design, each of the MIR laser sources generates a narrow linewidth, and accurately settable MIR beam.

The present invention is also directed to a missile jamming system for jamming an incoming missile. In this embodiment, the missile jamming system comprising the laser source assembly described herein directing the assembly output beam at the incoming missile.

In yet another embodiment, the laser source assembly includes (i) a first MIR laser source that emits a first MIR beam that is in the MIR range, (ii) a non-MIR laser source that emits a non-MIR beam that is outside the MIR range, and (iii) a beam combiner that combines the first MIR beam and the non-MIR beam to provide the assembly output beam.

The present invention is also directed to a method for generating a multiple watt, accurately settable, assembly output beam having a narrow linewidth.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
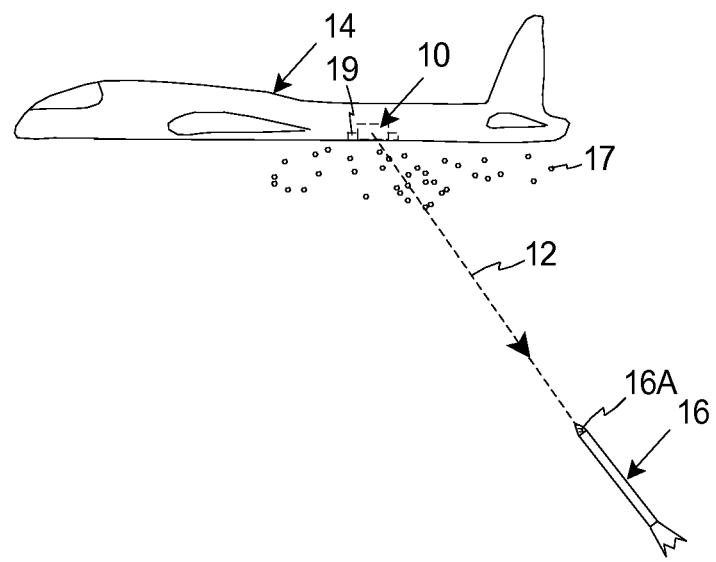
FIG. 1 is simplified side illustration of a missile, and an aircraft including a laser source assembly having features of the present invention.

FIG. 1 is simplified side illustration of a laser source assembly 10 (illustrated in phantom) having features of the present invention that generates an assembly output beam 12 (illustrated with a dashed arrow line). As an overview, in certain embodiments, the laser source assembly 10 includes a plurality MIR laser sources (not shown in FIG. 1) that are packaged in a portable, common module, each of the MIR laser sources generates a narrow linewidth, accurately settable MIR beam (not shown in FIG. 1), and the MIR beams are combined to create the assembly output beam 12. Further, each of the MIR laser sources can be a single emitter infrared semiconductor laser. As a result thereof, utilizing multiple single emitter infrared semiconductor lasers, the laser source assembly 10 can generate a multiple watt assembly output beam 12.

Further, each of the MIR laser sources can be individually tuned so that a specific wavelength of the MIR beams of one or more of the MIR laser sources is the same or different. Thus, the MIR laser sources can be tuned so that the assembly output beam 12 is primarily a single wavelength beam or is primarily a multiple wavelength (incoherent) beam. Further, the power output of the assembly output beam 12 can be adjusted by changing the number of MIR laser sources. As a result thereof, the characteristics of the assembly output beam 12 can be adjusted to suit the application for the laser source assembly 10.

In certain embodiment, each MIR laser source is an external cavity, quantum cascade laser that is packaged in a common thermally stabilized and opto-mechanically stable assembly along with an integrated beam combining optics allowing to spectrally or spatially combine the outputs of the multiple external cavity, quantum cascade lasers.

There are a number of possible usages for the laser source assembly 10 disclosed herein. For example, as illustrated in FIG. 1, the laser source assembly 10 can be used on an aircraft 14 (e.g. a plane or helicopter) to protect that aircraft 12 from a heat seeking missile 16. In this embodiment, the missile 16 is locked onto the heat emitting from the aircraft 14, and the laser source assembly 10 emits the assembly output beam 12 that protects the aircraft 14 from the missile 16. For example, the assembly output beam 12 can be directed at the missile 16 to jam the guidance system 16A (illustrated as a box in phantom) of the missile 16. In this embodiment, the laser source assembly 10 functions as a jammer of an anti-aircraft missile.

The exact wavelength of the MIR beams that effectively jams the guidance system 16A is not currently know by the Applicants. However, with the present invention, the MIR laser sources can be accurately tuned to the appropriate wavelength in the MIR range for jamming the guidance system 16A.

Another important aspect of the MIR beams is the ability propagate through the atmosphere 17 (illustrated as small circles) with minimal absorption. Typically, the atmosphere 17 absorption is mainly due to water and carbon dioxide. Atmospheric propagation requires narrow linewidth and accurate settable wavelength to avoid absorption. With the present invention, the MIR laser sources each generates a narrow linewidth MIR beam, and each of the MIR laser sources can be individually tuned so that each MIR beam is at a wavelength that allows for maximum transmission through the atmosphere 17. Stated in another fashion, the wavelength of each MIR beam is specifically selected to avoid the wavelengths that are readily absorbed by water or carbon dioxide.

Alternatively, for example, the laser source assembly 16 can be used for a free space communication system in which the laser source assembly 16 is operated in conjunction with an IR detector located far away, to establish a wireless, directed, invisible data link. Still alternatively, the laser source assembly 16 can be used for any application requiring transmittance of directed infrared radiation through the atmosphere at the distance of thousands of meters, to simulate a thermal source to test IR imaging equipment, as an active illuminator to assist imaging equipment, or any other application.

Additionally, the laser source assembly 10 can include a non-MIR laser source (not shown in FIG. 1) that generates a non-MIR beam that is outside the MIR range. In this embodiment, the non-MIR beam is also combined with the MIR beams to provide a multiple band assembly output beam 12.

Further, in one embodiment, the laser source assembly 10 can include one or more vibration isolators 19 that isolate the components of the laser source assembly 10 from vibration.

A number of Figures include an orientation system that illustrates an X axis, a Y axis that is orthogonal to the X axis and a Z axis that is orthogonal to the X and Y axes. It should be noted that these axes can also be referred to as the first, second and third axes.

Figure 2A:
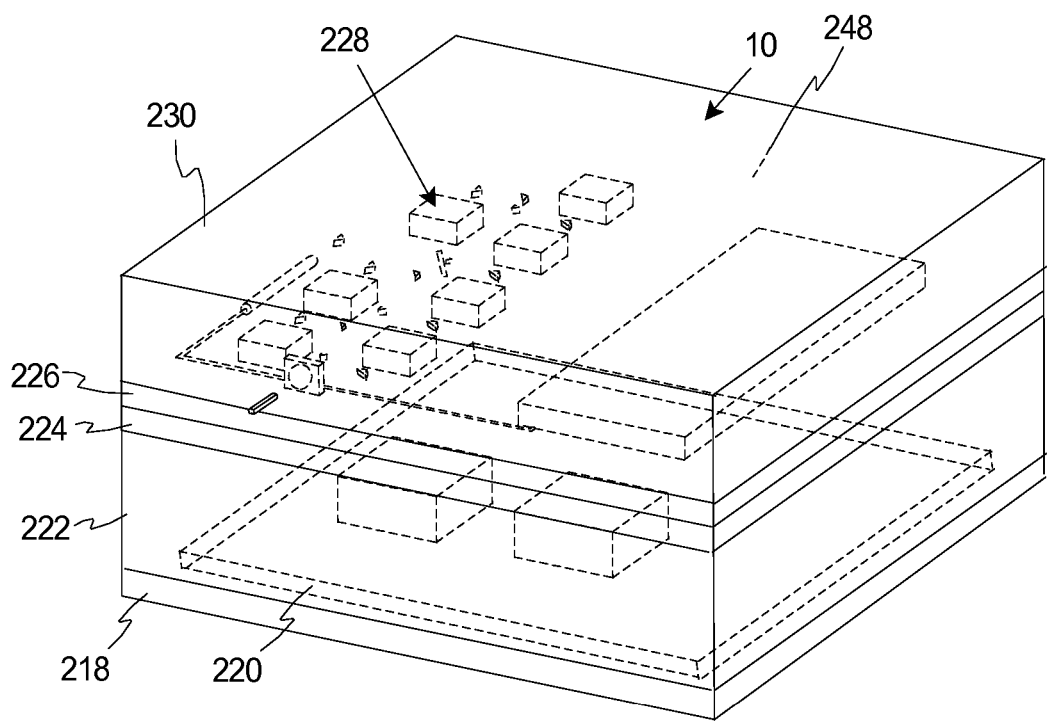
FIG. 2A is a simplified perspective view of the laser source assembly of FIG. 1.

FIG. 2A is a simplified perspective view of the laser source assembly 10 of FIG. 1. The design, size and shape of the laser source assembly 10 can be varied pursuant to the teachings provided herein. In FIG. 2A, the laser source assembly 10 is generally rectangular shaped and includes a bottom cover 218, a system controller 220 (illustrated in phantom) that is stacked on the bottom cover 218, a thermal module 222 that is stacked on the system controller 220, an insulator 224 that is stacked on top of the thermal module 222, a mounting base 226 that is stacked on top of the insulator 224, a laser system 228 that is secured to the mounting base 226, and a cover 230 that covers the laser system 228. Alternatively, the laser source assembly 10 can be designed with more or fewer components than are illustrated in FIG. 2A and/or the arrangement of these components can be different than that illustrated in FIG. 2A. Further, the size and shape of these components can be different than that illustrated in FIG. 2A.

It should be noted that the laser source 10 can be powered by a generator, e.g. the generator for the aircraft 14 (illustrated in FIG. 1), a battery, or another power source.

Figure 2B:
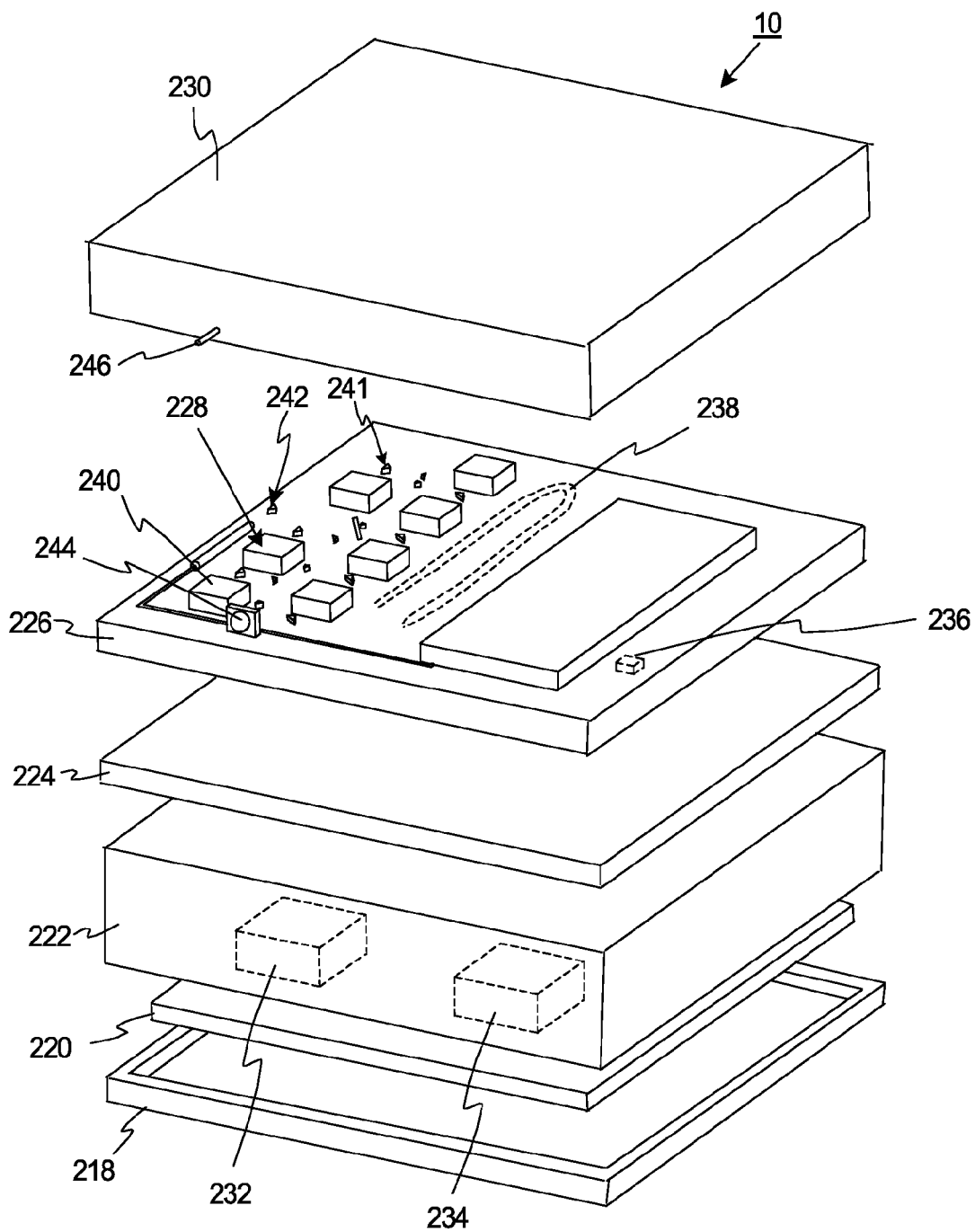
FIG. 2B is a simplified, partly exploded perspective view of the laser source assembly of FIG. 1.

FIG. 2B is a simplified, partly exploded perspective view of the laser source assembly 10. In this embodiment, the bottom cover 218 is rigid, and is shaped somewhat similar to an inverted top to a box. Alternatively, the bottom cover 218 can have another suitable configuration. Additionally, the bottom cover 218 can include on or more vents (not shown) for venting some of the components of the laser source assembly 10.

The system controller 220 controls the operation of the thermal module 222 and the laser system 228. For example, the system controller 220 can include one or more processors and circuits. In certain embodiments, the system controller 220 can control the electron injection current to the individual laser sources 240 of the laser system 228 and the temperature of the mounting base 226 and the laser system 228 to allow the user to remotely change the characteristics of the assembly output beam 12 (illustrated in FIG. 1).

The thermal module 222 controls the temperature of the mounting base 226 and the laser system 228. For example, the thermal module 222 can include (i) a heater 232 (illustrated in phantom), (ii) a chiller 234 (illustrated in phantom), and (iii) a temperature sensor 236 (illustrated in phantom) e.g. a thermistor. In one embodiment, the temperature sensor 236 is positioned at and provides feedback regarding the temperature of the mounting base 226, and the system controller 220 receives the feedback from the temperature sensor 236 to control the operation of the thermal module 222. With this design, the thermal module 222 is used to directly control the temperature of the mounting base 226 so that the mounting base 226 is maintained at a predetermined temperature. In one non-exclusive embodiment, the predetermined temperature is approximately 25 degrees Celsius. By maintaining the mounting base 226 at a predetermined temperature, the thermal module 222 can be used to control the temperature of the components of the laser system 228.

In one embodiment, the thermal module 222 is designed to selectively circulate hot or cold circulation fluid (not shown) through the mounting base 226 to control the temperature of the mounting base 226. In this embodiment, the chiller 234 and the heater 232 are used to control the temperature of the circulation fluid that is circulated in the mounting base 226. Alternatively, the thermal module 222 can be in direct thermal contact with the mounting base 226.

Additionally, or alternatively, the thermal module 222 can also include one or more cooling fans and vents to further remove the heat generated by the operation of the laser source assembly 10.

The insulator 224 that is positioned between the mounting base 226 and the thermal module 222 and the insulator 224 thermally isolates the thermal module 222 from the mounting base 226 while allowing the thermal module 222 to circulate the circulation fluid through the mounting base 226.

The mounting base 226 provides a rigid, one piece platform for support the components of the laser system 228 and maintain the relative position of the components of the laser system 228. In one non-exclusive embodiment, the mounting base 226 is monolithic, and generally rectangular plate shaped, and includes a plurality of embedded base passageways 238 (only a portion of which is illustrated in phantom) that allow for the circulation of the hot and/or cold circulation fluid through the mounting base 226 to maintain the temperature of the mounting base 226 and the components mounted thereon. The mounting base 226 can also be referred to as a cold plate.

Non-exclusive examples of suitable materials for the mounting base 226 include magnesium, aluminum, and carbon fiber composite.

The laser system 228 generates the assembly output beam 12 (illustrated in FIG. 1). The design of the laser system 228 and components used therein can be varied pursuant to the teachings provided herein. In one embodiment, the laser system 228 includes (i) a plurality of spaced apart, individual laser sources 240 that are fixedly secured to the mounting base 226, and (ii) a beam combiner 241 that includes a director assembly 242 that is fixedly secured to the mounting base 226, and a beam focus assembly 244. The laser system 228 will be described in more detail below.

The cover 230 covers the laser system 228 and provides a controlled environment for the laser system 228. More specifically, the cover 230 can cooperate with the mounting base 226 to define a sealed laser chamber 248 (illustrated in FIG. 2A) that encloses the laser sources 240. Further, an environment in the sealed laser chamber 248 can be controlled. For example, the sealed laser chamber 248 can be filled with an inert gas, or another type of fluid, or the sealed laser chamber 248 can be subjected to vacuum. In one embodiment, cover 220 is rigid, and is shaped somewhat similar to an inverted top to a box.

Figures 3A, 3B:
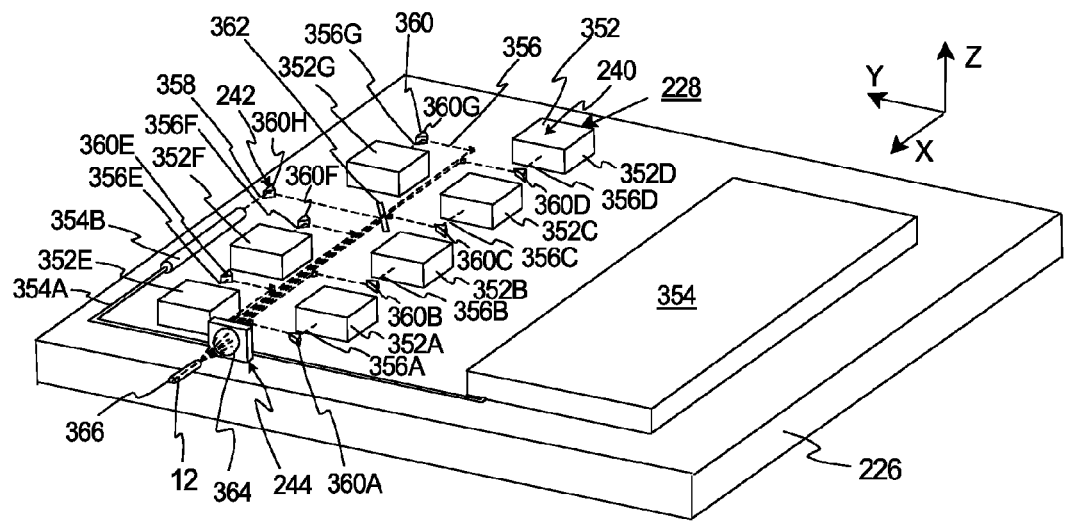
FIG. 3A is a perspective view of a mounting base, a plurality of laser sources, and a beam combiner having features of the present invention.
FIG. 3B is a simplified illustration of the plurality of laser sources, and the beam combiner of FIG. 3A.

FIG. 3A is a simplified perspective view and FIG. 3B is a simplified top view of the mounting base 226, and the laser system 228. In this embodiment, the laser system 228 includes the plurality of laser sources 240, and the beam combiner 241 including the beam director assembly 242, and the beam focus assembly 244.

The number and design of the laser sources 240 can be varied to achieve the desired characteristics of the assembly output beam 12 (illustrated as a dashed line). In FIGS. 3A and 3B, the laser system 228 includes eight separate laser sources 240 that are fixedly secured to the top of the mounting base 226. In this embodiment, seven of the laser sources 240 are MIR laser sources 352 and one of the laser sources 240 is a non-MIR laser source 354. Alternatively, the laser system 228 can be designed to have more or fewer than seven MIR laser sources 352, and/or more than one or zero non-MIR laser sources 354. For example, in alternative, non-exclusive embodiments, the laser system 228 can include three or eighteen separate MIR laser sources 352. It should be noted that the power output and other characteristics of the assembly output beam 12 (illustrated in FIG. 1) can be adjusted by changing the number of MIR laser sources 352.

In the embodiment illustrated in FIGS. 3A and 3B, each of the MIR laser sources 352 generates a separate MIR beam 356 (illustrated as a dashed line) having a center wavelength that is within the MIR range, and the non-MIR laser source 354 generates a non-MIR beam 358 (illustrated as a dashed line) having a center wavelength that is outside the MIR range. In one non-exclusive embodiment, each MIR beam 356 can have a center wavelength of approximately 4.6 μm, and the non-MIR beam 358 can have a center wavelength of approximately 2.0 μm.

It should be noted that in this embodiment, the seven MIR laser sources 352 can be labeled (i) a first MIR source 352A that generates a first MIR beam 356A, (ii) a second MIR source 352B that generates a second MIR beam 356B, (iii) a third MIR source 352C that generates a third MIR beam 356C, (iv) a fourth MIR source 352D that generates a fourth MIR beam 356D, (v) a fifth MIR source 352E that generates a fifth MIR beam 356E, (vi) a sixth MIR source 352F that generates a sixth MIR beam 356F, and (vii) a seventh MIR source 352G that generates a seventh MIR beam 356G.

Figure 3C:
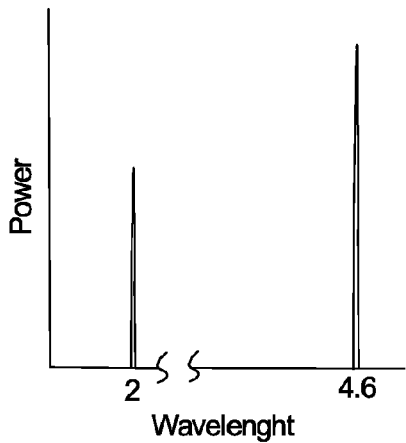
FIG. 3C is a simplified graph that illustrates the wavelengths of one embodiment of an assembly output beam having features of the present invention.

As provided herein, each of the MIR laser sources 352 can be individually tuned so that a specific wavelength of the MIR beams 356 of one or more of the MIR laser sources 352 is the same or different. Thus, the MIR laser sources 352 can be tuned so that the portion of the assembly output beam 12 generated by the MIR laser sources 352 is primarily a single wavelength beam or is primarily a multiple wavelength (incoherent) beam. In one non-exclusive example, each of the MIR source 352A-352G can be tuned so that each MIR beam 356A-356G has a center wavelength of 4.6 μm. FIG. 3C is a simplified graph that illustrates the wavelengths of this embodiment of the assembly output beam. More specifically, FIG. 3C illustrates that the assembly output beam has a wavelength that is at approximately 2.0 μm as a result of the non-MIR beam 358 and a wavelength that is at approximately 4.6 μm as a result of the MIR beams 356A-356G.

Figure 3D:
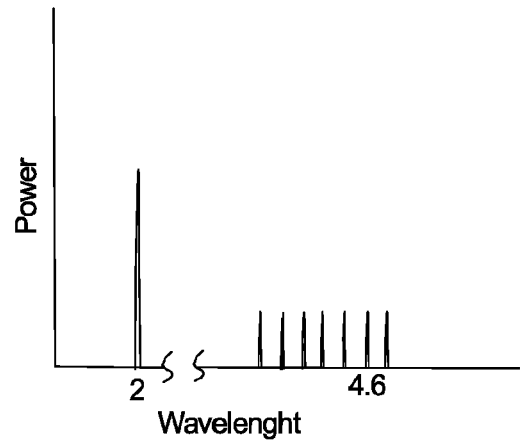
FIG. 3D is a simplified graph that illustrates the wavelengths of a portion of another embodiment of an assembly output beam having features of the present invention.

In an alternative, non-exclusive example, (i) the first MIR source 352A can be tuned so that the first MIR beam 356A has a center wavelength of 4.1 μm, (ii) the second MIR source 352B can be tuned so that the second MIR beam 356B has a center wavelength of 4.2 μm, (iii) the third MIR source 352C can be tuned so that the third MIR beam 356C has a center wavelength of 4.3 μm, (iv) the fourth MIR source 352D can be tuned so that the fourth MIR beam 356D has a center wavelength of 4.4 μm, (v) the fifth MIR source 352E can be tuned so that the fifth MIR beam 356E has a center wavelength of 4.5 μm, (vi) the sixth MIR source 352F can be tuned so that the sixth MIR beam 356F has a center wavelength of 4.6 μm, and (vii) the seventh MIR source 352G can be tuned so that the seventh MIR beam 356G has a center wavelength of 4.7 μm. FIG. 3D is a simplified graph that illustrates the wavelengths of this embodiment of the assembly output beam. More specifically, FIG. 3D illustrates that the assembly output beam has a wavelength of at approximately 2.0 μm as a result of the non-MIR beam 358, and wavelengths of approximately 4.1, 4.2, 4.3, 4.4, 4.5, 4.6 μm, and 4.7 μm as a result of the MIR beams 356A-356G.

Referring back to FIGS. 3A and 3B, it should be noted that the exact wavelength of the MIR beams 356A-356G and the non-MIR beam 358 can be selected so that the resulting assembly output beam 12 propagates through the atmosphere with minimal absorption.

It should be noted that each MIR laser source 352 can generate a MIR beam 356 having a power of between approximately 0.5 and 3 watts. As a result thereof, the seven MIR laser sources 352A-352G can generate a combined power of between approximately 3.5 and 21 watts.

With the designs provided herein, each MIR beam 356A-356G has a relatively narrow linewidth. In non-exclusive examples, the MIR laser sources 352A-352G can be designed so that the linewidth of each MIR beam 356A-356G is less than approximately 5, 4, 3, 2, 1, 0.8, 0.5, or 0.1 cm-1. Alternatively, the MIR laser sources 352A-352G can be designed so that the line width of each MIR beam 356A-356G is greater than approximately 7, 8, 9, or 10 cm-1. The spectral width of the MIR beams 356A-356G can be adjusted by adjusting the cavity parameters of the external cavity of the respective MIR laser sources 352A-352G. For example, the spectral width of the MIR beams 356A-356G can be increased by decreasing wavelength dispersion of intracavity wavelength selector.

One embodiment of a suitable MIR laser source 352 is described in more detail below with reference to FIG. 4. Each MIR laser source 352 can also be referred to as a Band 4 laser source.

One embodiment of a suitable non-MIR laser source 354 is a diode-pumped Thulium-doped fiber laser. A suitable non-MIR laser source 354 can be purchased from IPG Photonics, located in Oxford, Mass. The non-MIR laser source 354 can also be referred to as a Band 1 laser source. In one embodiment, the non-MIR laser source 354 generates a non-MIR beam 358 having a power of between approximately one to ten watts, and a linewidth of less than approximately 2.5 cm-1.

In one embodiment, the non-MIR laser source 354 can include a non-MIR optical fiber 354A that guides the non-MIR beam 358 from the body of the non-MIR laser source 354, and a fiber collimator 354B that collimates and launches the non-MIR beam 358.

The beam combiner 241 combines the multiple MIR beams 356 and the non-MIR beam 358. In the embodiment illustrated in FIG. 3A, the beam combiner 241 includes the beam director assembly 242 and the beam focus assembly 244. Alternatively, for example, as described in more detail below, the beam combiner 241 can be designed without the beam focus assembly 244.

The beam director assembly 242 directs and steers the MIR beams 356 and the non-MIR beam 358 at the beam focus assembly 244. As provided herein, in one embodiment, the beam director assembly 242 directs the MIR beams 356 and the non-MIR beam 358 at the beam focus assembly 244 and in a substantially parallel arrangement with a combiner axis 244A of the beam focus assembly 244. Stated in another fashion, the beam director assembly 242 combines the MIR beams 356 and the non-MIR beam 358 by directing the beams 356, 358 to be parallel to each other (e.g. travel along parallel axes). Further, beam director assembly 242 causes the MIR beams 356 and the non-MIR beam 358 to be directed in the same direction, with the beams 356, 358 overlapping, or are adjacent to each other.

In one embodiment, the beam director assembly 242 can include a plurality of beam directors 360 and a dichroic filter 362 that are secured to the mounting base 226. Each beam director 360 can be beam steering prism that includes a coating that reflects light in the MIR range. Further, the dichroic filter 362 can transmit beams in the MIR range while reflecting beams in the non-MIR range. Stated in another fashion, the dichroic filter 362 can transmit MIR beams 356 and reflect the non-MIR beam 358. More specifically, in this embodiment, the dichroic filter 362 reflects the non-MIR beam 358, and transmits the third, fourth and seventh MIR beams 356C, 356D, 356G.

More specifically, in the embodiment illustrated in FIGS. 3A and 3B, the beam director assembly 242 can include (i) a pair of first beam directors 360A that cooperate to steer the first MIR beam 356A to be approximately parallel to and adjacent to the combiner axis 244A; (ii) a pair of second beam directors 360B that cooperate to steer the second MIR beam 356B to be approximately parallel to and adjacent to the combiner axis 244B; (iii) a pair of third beam directors 360C that cooperate to steer the third MIR beam 356C to be approximately parallel to and adjacent to the combiner axis 244A; (iv) a pair of fourth beam directors 360D that cooperate to steer the fourth MIR beam 356D to be approximately coaxial with the combiner axis 244A; (v) a pair of fifth beam directors 360E that cooperate to steer the fifth MIR beam 356E to be approximately parallel to and adjacent to the combiner axis 244A; (vi) a pair of sixth beam directors 360F that cooperate to steer the sixth MIR beam 356F to be approximately parallel to and adjacent to the combiner axis 244A; (vii) a pair of seventh beam directors 360G that cooperate to steer the seventh MIR beam 356G to be approximately parallel to and adjacent to the combiner axis 244A; and (vii) a ninth beam director 360H and the dichroic filter 362 that cooperate to steer the non-MIR beam 358 to be approximately axial with the combiner axis 244A. Further, in this embodiment, each of the beams 356A-356G are controlled by the beam director assembly 242 to be directed in the same direction (e.g. at the beam focus assembly 244).

In this embodiment, the individual MIR beams 356A-356G and the non-MIR beam 358 are steered to co-propagate parallel to each other at the distance between the beam centers of each MIR beams 356A-356G being close to the individual beam diameter of each MIR beams 356A-356G. With this design, the beams 356A-356G, 358 propagate along parallel axes.

It should be noted that one or more of the beam directors 360A-360H and/or the dichroic filter 362 can be mounted to the mounting base 226 in a fashion that allows that respective component to be accurately and individually moved relative to the mounting base 226 about the Z axis and about the Y axis. With this design, the beam directors 360A-360H and/or the dichroic filter 362 can be accurately rotated to properly direct the respective beam at the beam focus assembly 244.

Figure 3E:
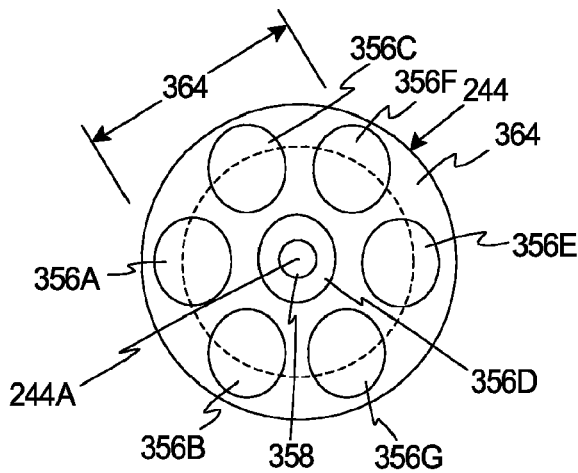
FIG. 3E is a simplified illustration of a portion of the beam combiner of FIG. 3A and a plurality of beams.

FIG. 3E is a simplified illustration of a combiner lens 364 of the beam focus assembly 244, with the plurality of MIR beams 356A-356G and the non-MIR beam 358 directed thereon. In this embodiment, the beam director assembly 242 (illustrated in FIG. 3B) is positioned so that (i) the fourth MIR beam 356D and the non-MIR beam 358 are overlapping and are incident on the combiner lens 364 approximately coaxial with the combiner axis 244A; (ii) the first MIR beam 356A, the second MIR beam 356B, the third MIR beam 356C, the fifth MIR beam 356E, the sixth MIR beam 356F, and the seventh MIR beam 356G are incident on the combiner lens 364 approximately parallel to and adjacent to the combiner axis 244A; and (iii) the first MIR beam 356A, the second MIR beam 356B, the third MIR beam 356C, the fifth MIR beam 356E, the sixth MIR beam 356F, and the seventh MIR beam 356G are spaced apart around the fourth MIR beam 356D and the non-MIR beam 358. Further, in one non-exclusive embodiment, the pattern of the first MIR beam 356A, the second MIR beam 356B, the third MIR beam 356C, the fifth MIR beam 356E, the sixth MIR beam 356F, and the seventh MIR beam 356G are arranged to have a diameter 365 of approximately six millimeters.

Alternatively, the beam directors 360A-360H can be adjusted so that the MIR beams 356A-356G and the non-MIR beam 358 form another pattern and/or the pattern has an outer diameter 365 that is greater than or less than approximately six millimeters.

Referring back to FIGS. 3A and 3B, the beam focus assembly 244 spatially combines and optically multiplexes the MIR beams 356A-356G and the non-MIR beam 358 to provide the assembly output beam 12. In one embodiment, the beam focus assembly 244 includes the combiner lens 364 and an output optical fiber 366. The design of the combiner lens 364 and an output optical fiber 366 can vary pursuant to the teachings provided herein.

In one embodiment, the combiner lens 364 is a spherical lens having an optical axis that is aligned with the combiner axis 244A. In one embodiment, to achieve the desired small size and portability, the combiner lens 364 has a relatively small diameter. In alternative, non-exclusive embodiments, the combiner lens 364 has a diameter of less than approximately 10 or 15 millimeters, and a focal length of approximately 1, 2, 3, 4, 5, 6, 7, 8, 9, 10, 11, 12, 13, 14, 15, 16, 17, 18, 19, 20, 21, 22, 23, 24 or 25 mm and any fractional values thereof. The combiner lens 364 can comprise materials selected from the group of Ge, ZnSe, ZnS Si, CaF, BaF or chalcogenide glass. However, other materials may also be utilized that are effective with the wavelengths of the MIR beams 356A-356G and the non-MIR beam 358. The combiner lens 364 may be spherical or aspjerical. The lens can be designed to have numerical aperture (NA) which matches that of a fiber and to have a clear aperture that matches the diameter of a combined beam pattern. In one embodiment, the combiner lens 364 is secured to the mounting base 226.

In one embodiment, the single combiner lens 364 focuses the MIR beams 356A-356G and the non-MIR beam 358 onto a fiber facet 366A of the output optical fiber 366 to spatially combine these beams 356A-356G, 358 into the assembly output beam 12. In one embodiment, the output optical fiber 366 is multi-mode fiber that transmits the multiple mode, output optical fiber 366

Figure 3F:
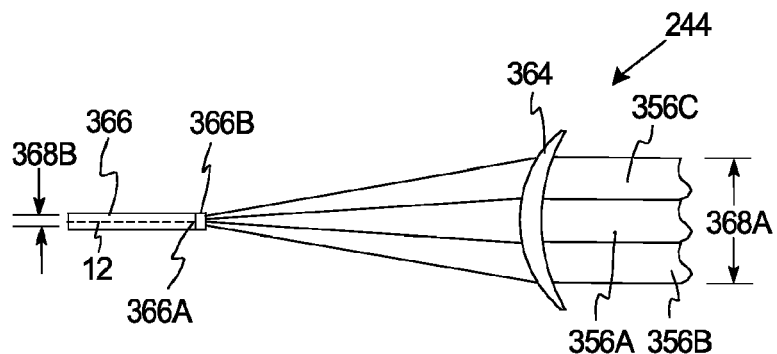
FIG. 3F is another simplified illustration of a portion of the beam combiner and three beams.

FIG. 3F is another simplified side illustration of the combiner lens 364 and the output optical fiber 366 of the beam focus assembly 244, and three beams 356A, 356B, 356C that are being spatially combined into the assembly output beam 12.

In one, non-exclusive embodiment, a pre-combined overall diameter 368A of the combination of the beams 356A-356G, 358 prior to entry into the combiner lens 364 is approximately 9 millimeters and a combined overall diameter 368B of the combination of the beams 356A-356G, 358 on the facet plane of the output optical fiber 366 is approximately 0.100 millimeters. Stated in another fashion, in alternative non-exclusive embodiments, the beam focus assembly 244 can reduce the overall diameter of the combination of the beams 356A-356G, 358 at least approximately 10, 50, 100, or 500 from the pre-combined overall diameter 368A to the combined overall diameter 368B. It should be noted that in this example, that the MIR beams 356A-356G (see FIG. 3E) are parallel and adjacent to each other prior to entry into the combiner lens 364, that the combiner lens 364 focuses the MIR beams 356A-356G onto the output optical fiber 366, and that the combiner lens 364 causes the MIR beams 356A-356G to at least partly overlap at the facet plane of the output optical fiber 366.

In certain embodiments, the inlet to the output optical fiber 366 includes an AR (anti-reflection) coating 366B that coats the fiber facet 366A. The AR coating 366B allows beams to easily enter the fiber facet 366A and facilitates the entry of the beams 356A-356G, 358 into the output optical fiber 366. This improves the efficiency of the coupling between the combiner lens 364 and the output optical fiber 366, and reduces the amount of heat that is generated at the fiber facet 366A. Further, the AR coating 366B ensures that the majority of the power generated by the laser sources 352, 354 is transferred to the output optical fiber 366.

In one embodiment, the AR coating 366B has a relatively low reflectivity at both the MIR range and the non-MIR range (e.g. approximately 2.0 μm) of the non-MIR beam 358. In alternative, non-exclusive embodiments, the AR coating 366B can have a reflectivity of less than approximately 1, 2, 3, 4, or 5 percent at both the MIR range and the non-MIR range (e.g. approximately 2.0 μm) of the non-MIR beam 358.

In one embodiment, the output optical fiber 366 is secured to one of the sides of the cover 220 (illustrated in FIGS. 2A and 2B). Alternatively, for example, the output optical fiber 366 can be secured to the mounting base 226 (illustrated in FIGS. 3A and 3B).

It should be noted that it is important to obtain and maintain the precise relative position between the combiner lens 364 and the fiber facet 366A of the output optical fiber 366. Thus, in certain embodiments, a retainer bracket (not shown) can be used to fixedly and accurately secure the combiner lens 364 and the fiber facet 366A of the output optical fiber 366 together.

Figure 4:
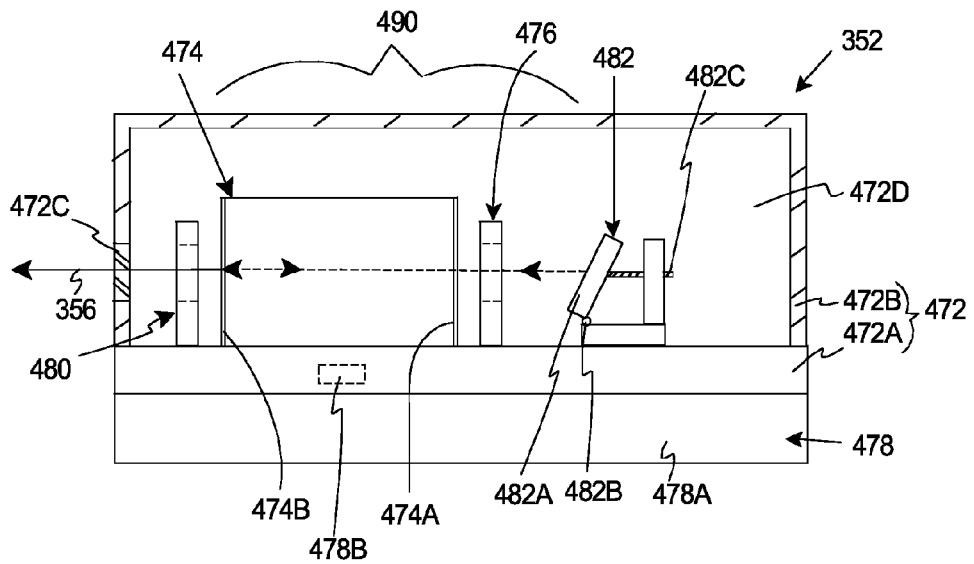
FIG. 4 is a simplified cut-away view of one of the laser sources of FIG. 3A.

FIG. 4 is a simplified cut-away view of non-exclusive example of one of the MIR laser sources 352 that can be used in laser source assembly 10 (illustrated in FIG. 1). It should be noted that each of the MIR laser source 352A-352G illustrated in FIGS. 3A and 3B can be similar in design to the MIR laser source 352 illustrated in FIG. 4. Stated in another fashion, the MIR laser source 352 illustrated in FIG. 4 can be used as the first MIR source 352A, the second MIR source 352B, the third MIR source 352C, the fourth MIR source 352D, the fifth MIR source 352E, the sixth MIR source 352F, or the seventh MIR source 352G.

In FIG. 4, the MIR laser source 352 is an external cavity (EC), narrow linewidth, quantum cascade laser (QCL). With this design, the MIR output beam 356 for each MIR laser source 352 can be characterized by near-diffraction limited divergence, approximately 100 mW output optical power, narrow linewidth and specific wavelength in MIR spectral range, selected to avoid atmospheric interferences in a said spectral range. Further, the EC-QLC provides stable, predictable spectral emission that does not drift over time.

In the embodiment illustrated in FIG. 4, the MIR laser source 352 includes a source frame 472, a quantum cascade ("QC") gain media 474, a cavity optical assembly 476, a temperature controller 478, an output optical assembly 480, and a wavelength dependant ("WD") feedback assembly 482 that cooperate to generate the fixed, output beam 356. The design of each of these components can be varied pursuant to the teachings provided herein. In should be noted that the MIR laser source 352 can be designed with more or fewer components than described above.

The source frame 472 supports the components of the MIR laser source 352. In one embodiment, (i) the QC gain media 474, the cavity optical assembly 476, the output optical assembly 480, and the WD feedback assembly 482 are each secured, in a rigid arrangement to the source frame 472; and (ii) the source frame 472 maintains these components in precise mechanical alignment to achieve the desired wavelength of the MIR output beam 356. Additionally, in FIG. 4, the temperature controller 478 is fixedly secured to the source frame 472.

The design of the source frame 472 can be varied to achieve the design requirements of the MIR laser source 352. In FIG. 4, the source frame 472 is generally rectangular shaped and includes a mounting base 472A, and a cover 472B. Alternatively, for example, the source frame 472 can be designed without the cover 472B and/or can have a configuration different from that illustrated in FIG. 4.

The mounting base 472A provides a rigid platform for fixedly mounting the QC gain media 474, the cavity optical assembly 476, the output optical assembly 480 and the WD feedback assembly 482. In one embodiment, the mounting base 472A is a monolithic structure that provides structural integrity to the MIR laser source 352. In certain embodiments, the mounting base 472A is made of rigid material that has a relatively high thermal conductivity. In one non-exclusive embodiment, the mounting base 472A has a thermal conductivity of at least approximately 170 watts/meter K. With this design, in addition to rigidly supporting the components of the MIR laser source 352, the mounting base 472A also readily transfers heat away from the QC gain media 474 to the temperature controller 478. For example, the mounting base 472A can be fabricated from a single, integral piece of copper, copper-tungsten or other material having a sufficiently high thermal conductivity. The one piece structure of the mounting base 472A maintains the fixed relationship of the components mounted thereto and contributes to the small size and portability of the MIR laser source 10.

In FIG. 4, the cover 472B is shaped somewhat similar to an inverted, open rectangular box, and the cover 472B can include a transparent window 472C that allows the MIR output beam 356 to pass through the cover 472B. In one embodiment, the cover 472B is hermetically sealed to the mounting base 472A in an air tight manner. This allows the source frame 472 to provide a controlled environment around some of the components. For example, a cover cavity 472D formed by the source frame 472 can be filled with a fluid such as nitrogen or an air/nitrogen mixture to keep out moisture and humidity; or the cover cavity 472D can be subjected to a vacuum.

In certain embodiments, the overall size of the source frame 472 is quite small. For example, the source frame 472 can have dimensions of approximately 20 centimeters (height) by 20 centimeters (width) by 20 centimeters (length) (where length is taken along the propagation direction of the laser beam) or less, and more preferably, the source frame 12 has dimensions of approximately 3 centimeters (height) by 4 centimeters (width) by 5 centimeters (length). Still alternatively, the source frame 472 can have dimensions of less than approximately 10 millimeters (height) by 25 millimeters (width) by 30 millimeters.

The QC gain media 474 is a unipolar semiconductor laser that includes a series of energy steps built into the material matrix while the crystal is being grown. With this design, electrons transmitted through the QC gain media 474 emit one photon at each of the energy steps. In one embodiment, the QC gain media 474 uses two different semiconductor materials such as InGaAs and AlInAs (grown on an InP or GaSb substrate for example) to form a series of potential wells and barriers for electron transitions. The thickness of these wells/barriers determines the wavelength characteristic of the QC gain media 474. Fabricating QC gain media of different thickness enables production of MIR laser having different output frequencies within the MIR range.

It should be noted that fine tuning of the MIR output beam 356 may be achieved by controlling the temperature of the QC gain media 474, such as by changing the DC bias current. Such temperature tuning is relatively narrow and may be used to vary the wavelength by approximately 1-2 gigahertz/Kelvin which is typically less than 0.01% of the peak emission wavelength.

In the case of QC gain media 474, the "diode" has been replaced by a conduction band quantum well. Electrons are injected into the upper quantum well state and collected from the lower state using a superlattice structure. The upper and lower states are both within the conduction band. Replacing the diode with a single-carrier quantum well system means that the generated photon energy is no longer tied to the material bandgap. This removes the requirement for exotic new materials for each wavelength, and also removes Auger recombination as a problem issue in the active region. The superlattice and quantum well can be designed to provide lasing at almost any photon energy that is sufficiently below the conduction band quantum well barrier.

As used herein the term QC gain media 474 shall also include Interband Cascade Lasers (ICL). ICL lasers use a conduction-band to valence-band transition as in the traditional diode laser. In one, non-exclusive embodiment, the semiconductor QCL laser chip is mounted epitaxial growth side down and a length of approximately four millimeters, a width of approximately one millimeter, and a height of approximately one hundred microns. A suitable QC gain media 474 can be purchased from Alpes Lasers, located in Switzerland.

In FIG. 4, the QC gain media 474 includes (i) a first facet 474A that faces the cavity optical assembly 476 and the WD feedback assembly 482, and (ii) a second facet 474B that faces the output optical assembly 480. In this embodiment, the QC gain media 474 emits from both facets 474A, 474B.

In one embodiment, the first facet 474A is coated with an anti-reflection ("AR") coating and the second facet 474B is coated with a reflective coating. The AR coating allows light directed from the QC gain media 474 at the first facet 474A to easily exit the QC gain media 474 and allows the light reflected from the WD feedback assembly 482 to easily enter the QC gain media 474. In contrast, the reflective coating reflects at least some of the light that is directed at the second facet 474B from the QC gain media 474 back into the QC gain medium 474. In one non-exclusive embodiment, the AR coating can have a reflectivity of less than approximately 2 percent, and the reflective coating can have a reflectivity of between approximately 2-95 percent. In this embodiment, the reflective coating acts as an output coupler for the external cavity 490.

The QC gain media 474 generates a relatively strong output IR beam and also generates quite a bit of heat. Accordingly, the temperature controller 478 can be an important component that is needed to remove the heat, thereby permitting long lived operation of the MIR laser source 352.

The cavity optical assembly 476 is positioned between the QC gain media 474 and the WD feedback assembly 482 along the lasing axis (along the X axis in Figures), and collimates and focuses the light that passes between these components. For example, the cavity optical assembly 476 can include one or more lens. For example, the lens can be an aspherical lens having an optical axis that is aligned with the lasing axis. In one embodiment, to achieve the desired small size and portability, the lens has a relatively small diameter. In alternative, non-exclusive embodiments, the lens has a diameter of less than approximately 5 or 10 millimeters, and a focal length of approximately 1, 2, 3, 4, 5, 6, 7, 8, 9, 10, 11, 12, 13, 14, 15, 16, 17, 18, 19, or 20 mm and any fractional values thereof. The lens can comprise materials selected from the group of Ge, ZnSe, ZnS Si, CaF, BaF or chalcogenide glass. However, other materials may also be utilized. The lens may be made using a diamond turning or molding technique. The lens can be designed to have a relatively large numerical aperture (NA). For example, the lens can have a numerical aperture of at least approximately 0.6, 0.7, or 0.8. The NA may be approximated by the lens diameter divided by twice the focal length. Thus, for example, a lens diameter of 5 mm having a NA of 0.8 would have a focal length of approximately 3.1 mm.

The temperature controller 478 can be used to control the temperature of the QC gain media 474, the mounting base 472A, and/or one or more of the other components of the MIR laser source 352. In one embodiment, the temperature controller 478 includes a thermoelectric cooler 478A and a temperature sensor 478B. The thermoelectric cooler 478A may be controlled to effect cooling or heating depending on the polarity of the drive current thereto. In FIG. 4, the thermoelectric cooler 478A is fixed to the bottom of the mounting base 472A so that the thermoelectric cooler 478A is in direct thermal communication with the mounting base 472A, and so that the thermoelectric cooler 478A can provide additional rigidity and support to the mounting base 472A. The temperature sensor 478B (e.g. a thermistor) provides temperature information that can be used to control the operation of the thermoelectric cooler 478A so that the thermoelectric cooler 478A can maintain the desired temperature of the MIR laser source 352.

The output optical assembly 480 is positioned between the QC gain media 474 and the window 472C in line with the lasing axis; and the output optical assembly 480 collimates and focuses the light that exits the second facet 474B of the QC gain media 474. For example, the output optical assembly 480 can include one or more lens that can be somewhat similar in design to the lens of the cavity optical assembly 476.

The WD feedback assembly 482 reflects the light back to the QC gain media 474 along the lasing axis, and is used to precisely adjust the lasing frequency of the external cavity 490 and the wavelength of the MIR output beam 356. In this manner, the MIR output beam 356 may be tuned and set to a desired fixed wavelength with the WD feedback assembly 482 without adjusting the QC gain media 474. Thus, in the external cavity 490 arrangements disclosed herein, the WD feedback assembly 482 dictates what wavelength will experience the most gain and thus dominate the wavelength of the MIR output beam 356.

In certain embodiments, the WD feedback assembly 482 includes a wavelength dependent ("WD") reflector 482A that cooperates with the reflective coating on the second facet 474B of the QC gain media 474 to form the external cavity 490. The term external cavity 490 is utilized to designate the WD reflector 482A positioned outside of the QC gain media 474.

Further, the WD reflector 482A can be tuned to adjust the lasing frequency of the external cavity 490 and the wavelength of the MIR beam 356, and the relative position of the WD feedback assembly 482 can be adjusted to tune the MIR laser source 352. More specifically, the WD reflector 482A can be tuned to cause the MIR laser source 352 to generate the MIR beam 356 that is fixed at a precisely selected specific wavelength in the MIR range. Alternatively, the WD reflector 482A can be moved so that the MIR laser source 352 can be designed to generate a set of sequential, specific MIR beams 356 that span a portion or the entire the MIR range.

With the present invention, each MIR laser source 352 can be individually tuned so that each MIR beam 356 is at a wavelength that allows for maximum transmission through and minimum attenuation by the atmosphere. Stated in another fashion, the wavelength of each MIR beam 356 is specifically selected to avoid the wavelengths that are readily absorbed by water or carbon dioxide.

In alternative, non-exclusive embodiments, the WD feedback assembly 482 can be used to control the fixed wavelength of MIR beam 356 within the MIR range to within approximately 0.1, 0.01, 0.001, or 0.0001 microns. As a non-exclusive example, the WD feedback assembly 482 can be adjusted so that the MIR laser source 352 has a MIR beam 356 of (i) 4.625 microns, (ii) 4.626 microns, (iii) 4.627 microns, (iv) 4.628 microns, (v) 4.629 microns, (vi) 4.630 microns, or any other specific wavelength in the MIR range. In certain embodiments, with the designs provided herein, the MIR beam 356 has a relatively narrow line width. In non-exclusive examples, the MIR laser source 352 can be designed so that the line width of the MIR beam 356 is less than approximately 5, 4, 3, 2, 1, 0.8, or 0.5 cm-1.

The design of the WD feedback assembly 482 and the WD reflector 482A can vary pursuant to the teachings provided herein. Non-exclusive examples of a suitable WD reflector 482A includes a diffraction grating, a MEMS grating, prism pairs, a thin film filter stack with a reflector, an acoustic optic modulator, or an electro-optic modulator. A more complete discussion of these types of WD reflectors 482A can be found in the Tunable Laser Handbook, Academic Press, Inc., Copyright 1995, chapter 8, Pages 349-435, Paul Zorabedian.

The type of adjustment done to the WD reflector 482A to adjust the lasing frequency of the external cavity 490 and the wavelength of the output beam 356 will vary according to the type of WD reflector 482A. For example, if the WD reflector 482A is a diffraction grating, rotation of the diffraction grating relative to the lasing axis and the QC gain media 474 adjusts the lasing wavelength and the wavelength of the output beam 356. There are many different ways to precisely rotate and fix the position of the diffraction grating.

In FIG. 4, the WD feedback assembly 482 includes a pivot 482B (e.g. a bearing or flexure) that secures WD reflector 482A to the source frame 472, and an adjuster 482C (e.g. a threaded screw) that can be rotated (manually or electrically) to adjust the angle of the WD reflector 482A.

It should be noted that the position of the WD reflector 482 can be adjusted during manufacturing to obtain the desired wavelength of the MIR beam 356.

Further, it should be noted that MIR laser source 352 is tunable to a small degree by changing the temperature of the QC gain media 474 with the temperature controller 478 or by variation of the input current to the QC gain media 474.

Figure 5A:
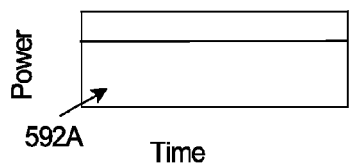
FIG. 5A includes a power chart that illustrates one embodiment of how power can be directed to one or more of the laser sources versus time, and an output chart that illustrates the resulting beam intensity versus time.
Figure 5A:
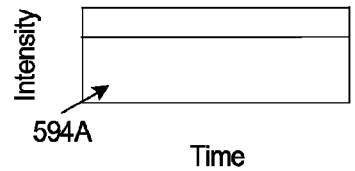

As provided herein, the system controller 220 (illustrated in FIG. 2A) individually directs current to each of the MIR laser sources 352A-352G (illustrated in FIGS. 3A and 3B) and the non-MIR laser source 354 (illustrated in FIGS. 3A and 3B). For example, the system controller 220 can continuously direct power to one or more of the MIR laser sources 352A-352G and/or the non-MIR laser source 354. FIG. 5A includes (i) a power graph 592A that illustrates the power directed to one of the laser sources 352A-352G, 354 versus time, and (ii) the resulting output graph 594A of the assembly output beam 12 (illustrated in FIG. 1) that illustrates the intensity versus time of the output beam 12. In this embodiment, the system controller 220 continuously directs power to the respective laser source over time. As a result thereof, the intensity of the output beam 12 is constant over time. In this operation mode, the laser source is a continuous wave laser that provides a continuous beam.

Figure 5B:
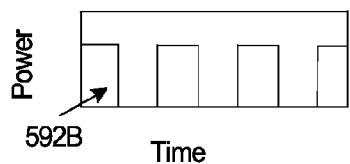
FIG. 5B includes a power chart that illustrates another embodiment of how power can be directed to one or more of the laser sources versus time, and an output chart that illustrates the resulting beam intensity versus time.
Figure 5B:
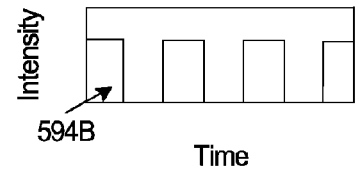

Alternatively, for example, the system controller 220 can direct power in a pulsed fashion to one or more of the MIR laser sources 352A-352G and/or the non-MIR laser source 354. FIG. 5B illustrates (i) a power graph 592B that illustrates the power directed to one of the laser sources 352A-352G, 354 versus time, and (ii) the resulting output graph 594B of the assembly output beam 12 (illustrated in FIG. 1) that illustrates the intensity versus time of the output beam 12. In this embodiment, the system controller 220 pulses the power directed to the laser source over time. As a result thereof, the intensity of the output beam 12 is also pulsed. In this operation mode, the laser source is a pulsed wave laser that provides a pulsed beam.

In the embodiment illustrated in FIG. 5B, the duty cycle is approximately fifty percent, e.g. the power is directed to the laser for a predetermined period of time and alternately the power is not directed to the laser for the same predetermined period. Alternatively, the duty cycle can be greater than or less than fifty percent.

In one, non-exclusive embodiment, the system controller 220 pulses approximately 5-20 watts peak power (as opposed to constant power) to the QC gain media 474 (illustrated in FIG. 4) in a low duty cycle wave form. With this design, the QC gain media 474 lases with little to no heating of the core of the QC gain media 474, the average power directed to the QC gain media 474 is relatively low, and the desired average optical power of the output beam 356 can be efficiently achieved. It should be noted that as the temperature of the QC gain media 474 increases, the efficiency of the QC gain media 474 decreases. With this embodiment, the pulsing of the QC gain media 4744 keeps the QC gain media 474 operating efficiently and the overall system utilizes relatively low power.

It should be noted that in the pulsed mode of operation, the system controller 220 can simultaneous direct pulses of power to each of the laser sources 352A-352G, 354 so that each of the laser sources 352A-352G, 354 generates the respective beam 356A-356G, 358 at the same time. Alternatively, the system controller 220 can direct pulses of power to one or more of the laser sources 352A-352G, 354 at different times so that the laser sources 352A-352G, 354 generate the respective beam 356A-356G, 358 at different times.

Figure 5C:
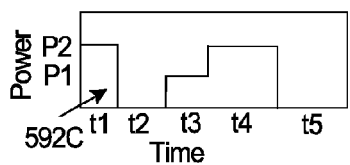
FIG. 5C includes a power chart that illustrates yet another embodiment of how power can be directed to one or more of the laser sources versus time, and an output chart that illustrates the resulting beam intensity versus time.
Figure 5C:
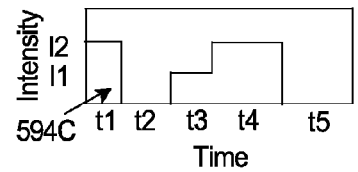

FIG. 5C illustrates (i) a power graph 592C that illustrates the power directed to one of the laser sources 352A-352G, 354 versus time, and (ii) the resulting output graph 594C of the assembly output beam 12 (illustrated in FIG. 1) that illustrates the intensity versus time of the output beam 12. As provided herein, the system controller 220 can include current driver electronics that pulses power to the laser sources 352A-352G, 354. This causes the laser source assembly 10 to generate a pulsed laser output beam 12 (illustrated in FIG. 1) with variable pulse width and repetition rate.

As a non-exclusive example, a particular pulsing pattern for the output beam 12 may be the most effective in jamming an incoming missile (illustrated in FIG. 1). The present invention, allows for the laser source assembly 10 to be controlled to generate the appropriately pulsed output beam 12. More specifically, as illustrated in FIG. 5C, the system controller 220 can control the pulsing of power (controlling power on and the power off times) to the laser sources 352A-352G, 354 to generate the output beam 12 with the desired pulse rate and the desired repetition rate.

For example, the system controller 220 can (i) direct power to the laser sources 352A-352G, 354 at a power level P2 for a time interval of t1, (ii) subsequently direct no power to the laser sources 352A-352G, 354 for a time interval of t2, (iii) subsequently direct power to the laser sources 352A-352G, 354 at a power level P1 for a time interval of t3, (iv) subsequently direct power to the laser sources 352A-352G, 354 at a power level P2 for a time interval of t4, and (v) subsequently direct no power to the laser sources 352A-352G, 354 for a time interval of t5. As illustrated in FIG. 5C, P1 is not equal to P2, and each of the time intervals (t1, t2, t3, t4, t5) are different. The resulting intensity of the output beam has a similar profile, with the output beam having (i) an intensity of I2 for the time interval of t1, (ii) an intensity of zero for the time interval of t2, (iii) an intensity of I1 for the time interval of t3, (iv) an intensity of I2 for the time interval of t4, and (v) an intensity of zero for the time interval of t5.

It should be noted that the power profile illustrated in FIG. 5C is just one, non-exclusive example of how the system controller 220 can be used to tailor the characteristic (e.g. the intensity, the pulse width and repetition rate) of the output beam 12.

As provided herein, the system controller 220 can accept analog, digital or software transmitted commands to pulse the assembly output beam 12 with the desired pulse width and repetition rate. This feature allows the user to precisely adjust the characteristics of the assembly beam 12 to meet the system requirements of the laser source assembly 10.

Additionally, it should be noted that the system controller 220 individually controls the temperature controller 478 (illustrated in FIG. 4) for each of the MIR laser sources 352A-352G (illustrated in FIG. 3A) to precisely control the temperature of each of the MIR laser sources 352A-352G. Further, the system controller 220 controls the thermal module 222 (illustrated in FIG. 2A) to precisely control the temperature of all of the laser sources 352A-352G, 354.

Figure 6:
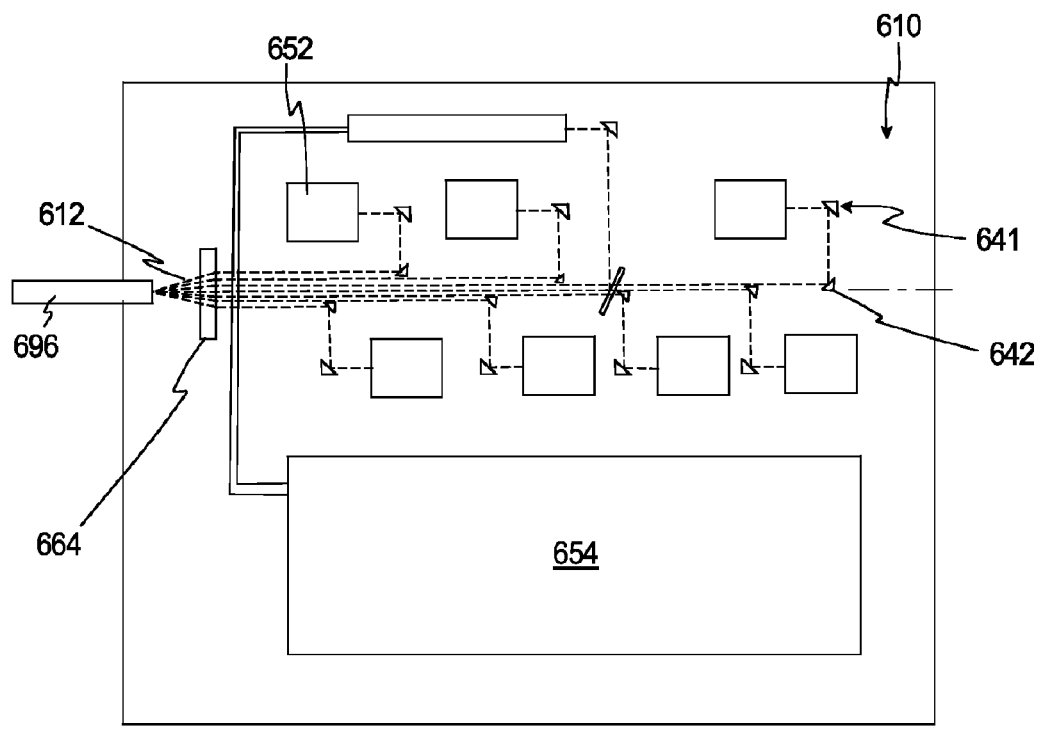
FIG. 6 is a simplified illustration of the plurality of laser sources, and another embodiment of the beam combiner.

FIG. 6 is a simplified illustration of a portion of another embodiment of a laser source assembly 610 that includes (i) seven MIR laser sources 652 and a non-MIR laser source 654 that are similar to the corresponding components described above, and (ii) a beam combiner 641 that includes a beam director assembly 642 and a combiner lens 664 that are similar to the corresponding components described above. However, in this embodiment, the output beam 612 from the combiner lens 664 is focused directly on an optical system 696 (illustrated as a box) without the use of an optical fiber.

Figure 7:
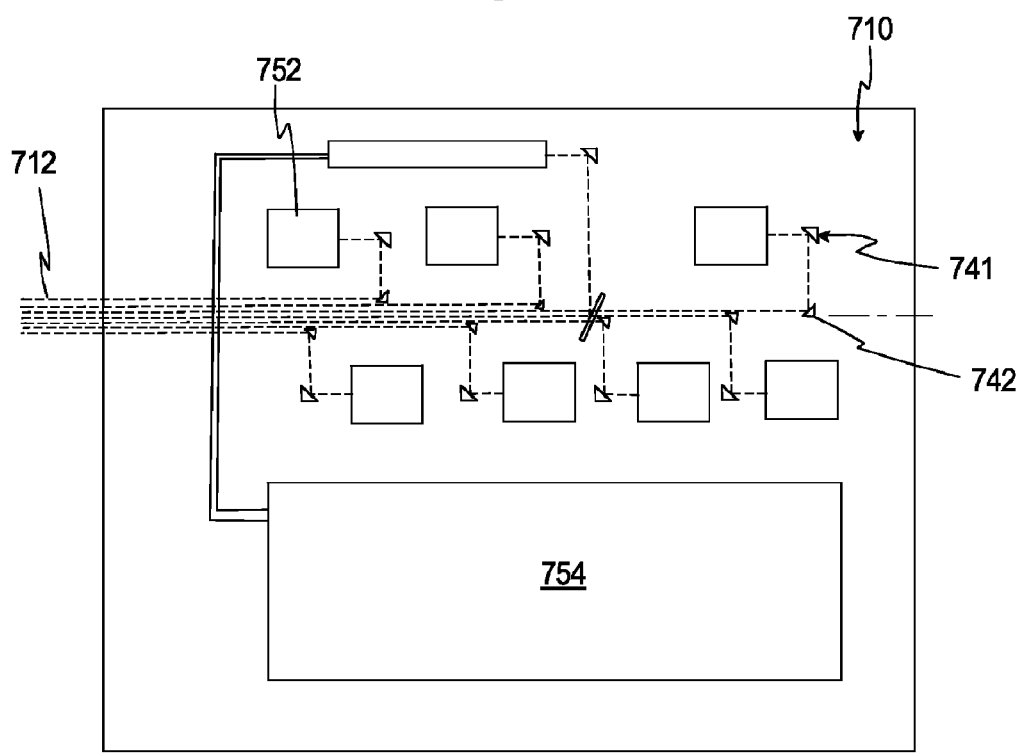
FIG. 7 is a simplified illustration of the plurality of laser sources, and yet another embodiment of the beam combiner.

FIG. 7 is a simplified illustration of a portion of another embodiment of a laser source assembly 710 that includes (i) seven MIR laser sources 752 and a non-MIR laser source 754 that are similar to the corresponding components described above, and (ii) a beam combiner 741 that includes a beam director assembly 742 that is similar to the corresponding component described above. However, in this embodiment, the beam combiner 741 does not include the combiner lens and the optical fiber. With this design, the output beam 712 can be directed into free space or at another optical system (not shown in FIG. 7).

Figure 8:
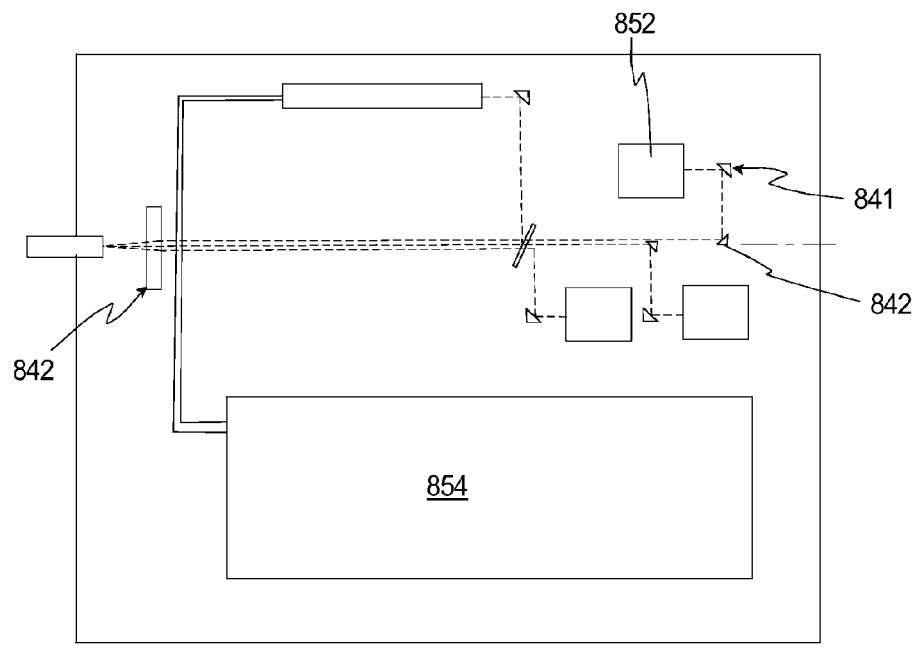
FIG. 8 is a simplified illustration of another embodiment of the plurality of laser sources, and the beam combiner.

FIG. 8 is a simplified illustration of a portion of another embodiment of a laser source assembly 810 that includes (i) three MIR laser sources 852 and a non-MIR laser source 854 that are similar to the corresponding components described above, and (ii) a beam combiner 841 that includes a beam director assembly 842 and a beam focus assembly 844 that are similar to the corresponding components described above. FIG. 8 illustrates that the laser source assembly 810 can include fewer than seven MIR laser sources 852. Alternatively, the laser source assembly 810 can be designed to have greater than seven MIR laser sources 852.

Figure 9A:
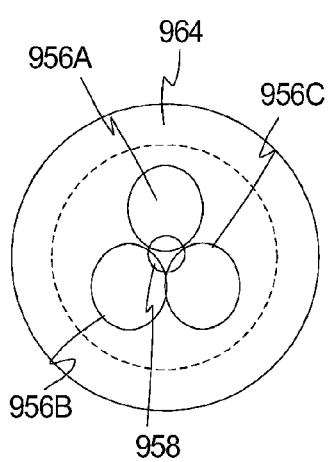
FIGS. 9A-9C are simplified alternative illustrations of a portion of the beam combiner of FIG. 8 and a plurality of beams.

FIG. 9A is a simplified illustration of a combiner lens 964 of the beam focus assembly 944, with the plurality of MIR beams 956A-956C and the non-MIR beam 958 directed thereon. In this embodiment, the beam director assembly 842 (illustrated in FIG. 8) has been positioned so that the three MIR beams 956A-956C are arranged in a triangular orientation and the non-MIR beam 958 is positioned in the center of the triangular orientation.

Figure 9B:
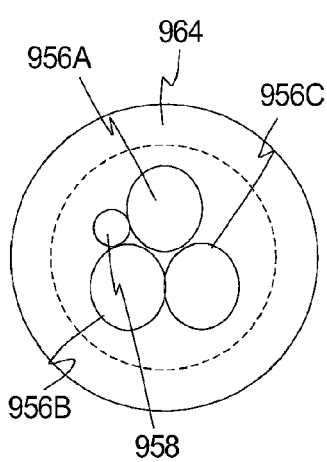

FIG. 9B is a simplified illustration of the combiner lens 964 of the beam focus assembly 944, with the plurality of MIR beams 956A-956C and the non-MIR beam 958 directed thereon. In this example, the beam director assembly 842 (illustrated in FIG. 8) has been positioned so that the three MIR beams 956A-956C are arranged in a triangular orientation and the non-MIR beam 958 is positioned outside the triangular orientation.

Figure 9C:
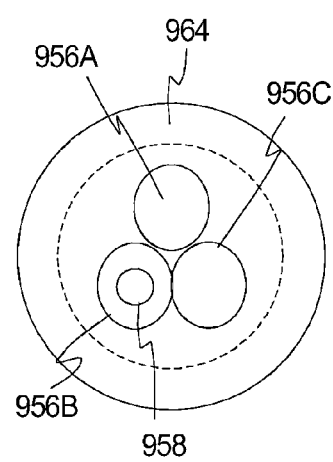

FIG. 9C is a simplified illustration of the combiner lens 964 of the beam focus assembly 944, with the plurality of MIR beams 956A-956C and the non-MIR beam 958 directed thereon. In this example, the beam director assembly 842 (illustrated in FIG. 8) has been positioned so that the three MIR beams 956A-956C are arranged in a triangular orientation and the non-MIR beam 958 is positioned to be overlapping one of the MIR beams 956A-956C.

It should be noted that the orientations illustrated in FIGS. 9A-9C are merely non-exclusive examples of possible orientations.

While the particular laser sources as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A laser source assembly for providing an assembly output beam along a combiner axis, the laser source assembly comprising:
a first laser source that emits a first beam;
a second laser source that emits a second beam; and
a beam combiner that includes (i) a pair of spaced apart first beam directors that are independently adjustable to reflect and redirect the first beam so that the first beam is approximately parallel to the combiner axis, (ii) a pair of spaced apart second beam directors that are independently adjustable to reflect and redirect the second beam so that the second beam is approximately parallel to and spaced apart from the first beam, and (iii) a combiner lens positioned on the combiner axis in the path of the first beam and the second beam, the combiner lens focusing the beams to provide the assembly output beam.

2. The laser source assembly of claim 1 wherein the beam combiner spatially combines the first beam and the second beam.

3. The laser source assembly of claim 1 wherein the first beam directors reflect the first beam to be substantially coaxial with the combiner axis.

4. The laser source assembly of claim 3 wherein the first beam directors reflect the first beam, and the second beam directors reflect the second beam so that a distance between a center of the first beam and a center of the second beam is approximately equal to a diameter of the first beam.

5. The laser source assembly of claim 1 further comprising an output optical fiber having a fiber facet; wherein the combiner lens focuses the beams onto the fiber facet.

6. The laser source assembly of claim 5 wherein the combiner lens has a numerical aperture that matches that of the output optical fiber.

7. The laser source assembly of claim 1 further comprising a third laser source that emits a third beam, and a dichroic filter that reflects the third beam so that the third beam is approximately parallel to the combiner axis and substantially coaxial with the first beam; wherein the dichroic filter transmits the first beam.

8. The laser source assembly of claim 1 further comprising (i) a third laser source that emits a third beam, (ii) a fourth laser source that emits a fourth beam, (iii) a pair of spaced apart third beam directors that are independently adjustable to reflect and redirect the third beam so that the third beam is approximately parallel to the combiner axis and spaced apart from the first beam and the second beam, and (iv) a pair of spaced apart fourth beam directors that are independently adjustable to reflect and redirect the fourth beam so that the fourth beam is approximately parallel to the combiner axis and spaced apart from the first beam, the second beam, and the third beam; and wherein the beams cooperate to encircle the combiner axis.

9. The laser source assembly of claim 1 further comprising (i) a third laser source that emits a third beam, (ii) a fourth laser source that emits a fourth beam, (iii) a fifth laser source that emits a fifth beam, (iv) a sixth laser source that emits a sixth beam, (v) a seventh laser source that emits a seventh beam, (vi) a pair of spaced apart third beam directors that are independently adjustable to reflect and redirect the third beam so that the third beam is approximately parallel to the combiner axis and spaced apart from the first beam and the second beam, (vii) a pair of spaced apart fourth beam directors that are independently adjustable to reflect and redirect the fourth beam so that the fourth beam is approximately parallel to the combiner axis and spaced apart from the first beam, the second beam, and the third beam; (viii) a pair of spaced apart fifth beam directors that are independently adjustable to reflect and redirect the fifth beam so that the fifth beam is approximately parallel to the combiner axis and spaced apart from the first beam, the second beam, the third beam, and the fourth beam, (ix) a pair of spaced apart sixth beam directors that are independently adjustable to reflect and redirect the sixth beam so that the sixth beam is approximately parallel to the combiner axis and spaced apart from the first beam, the second beam, the third beam, the fourth beam, and the fifth beam, and (x) a pair of spaced apart seventh beam directors that are independently adjustable to reflect and redirect the seventh beam so that the seventh beam is approximately parallel to the combiner axis and spaced apart from the first beam, the second beam, the third beam, the fourth beam, the fifth beam, and the sixth beam; wherein, the first beam is coaxial with the combiner axis, wherein the second beam, the third beam, the fourth beam, the fifth beam, the sixth beam, and the seventh beam cooperate to encircle the combiner axis; wherein the second, third, fourth, fifth, sixth and seventh beams are substantially equally spaced from the combiner axis; and wherein the second, third, fourth, fifth, sixth, and seventh beams are substantially equally spaced and positioned about a circle that is substantially coaxial with the combiner axis.

10. The laser source assembly of claim 9 wherein a distance between a center of the first beam and a center of the second beam is approximately equal to a diameter of the first beam.

11. The laser source assembly of claim 9 further comprising an eighth laser source that emits an eighth beam, and a dichroic filter that reflects the eighth beam so that the eighth beam is approximately parallel to the combiner axis and substantially coaxial with the first beam, the dichroic filter transmitting the first beam.

12. The laser source assembly of claim 11 wherein (i) the first beam has a center wavelength in the MIR range; (ii) the second beam has a center wavelength in the MIR range; (iii) the third beam has a center wavelength in the MIR range; (iv) the fourth beam has a center wavelength in the MIR range; (v) the fifth beam has a center wavelength in the MIR range; (vi) the sixth beam has a center wavelength in the MIR range; (vii) the seventh beam has a center wavelength in the MIR range; and (viii) the eight beam has a center wavelength that is outside the MIR range.

13. The laser source assembly of claim 1 wherein each beam director is independently adjustable about a first axis and about a second axis that is perpendicular to the first axis.

14. The laser source assembly of claim 1 wherein the first beam is at a first wavelength and the second beam is at a second wavelength, and wherein the first wavelength is different than the second wavelength.

15. The laser source assembly of claim 1 (i) wherein the first laser source includes a first QC gain media that generates a beam in the MIR range, and a first WD feedback assembly that can be tuned to select the desired wavelength of the first beam, and (ii) wherein the second laser source includes a second QC gain media that generates a beam in the MIR range, and a second WD feedback assembly that can be tuned to select the desired wavelength of the second beam.

16. A missile jamming system for jamming an incoming missile, the missile jamming system comprising the laser source assembly of claim 1 directing the output beam at the incoming missile.

17. A method for generating an assembly output beam, the method comprising the steps of:
emitting a first beam with a first laser source;
emitting a second beam with a second laser source;
reflecting and directing the first beam with a pair of spaced apart first beam directors which are independently adjustable so that the first beam is approximately parallel to a combiner axis;
reflecting and directing the second beam with a pair of spaced apart second beam directors which are independently adjustable so that the second beam is approximately parallel to and spaced apart from the first beam; and
focusing the beams with a combiner lens that is positioned on the combiner axis in the path of the first beam and the second beam.

18. The method of claim 17 wherein the combiner lens spatially combines the first beam and the second beam.

19. The method of claim 17 wherein steps of reflecting and directing the first beam includes reflecting and directing the first beam so that a distance between a center of the first beam and a center of the second beam is approximately equal to a diameter of the first beam.

20. The method of claim 17 wherein the step of focusing includes focusing the beams on a fiber facet of an output optical fiber, and wherein the combiner lens has a numerical aperture that matches that of the output optical fiber.

21. The method of claim 17 further comprising the steps of emitting a third beam with a third laser source, and reflecting the third beam with a dichroic filter so that the third beam is approximately parallel to the combiner axis and substantially coaxial with the first beam, the dichroic filter transmitting the first beam.

22. The method of claim 17 further comprising the steps of (i) emitting a third beam with a third laser source; (ii) emitting a fourth beam with a fourth laser source; (iii) reflecting and directing the third beam with a pair of spaced apart third beam directors which are independently adjustable so that the third beam is approximately parallel to the combiner axis and spaced apart from the first beam and the second beam, and (iv) reflecting and directing the fourth beam with a pair of spaced apart fourth beam directors which are independently adjustable so that the fourth beam is approximately parallel to the combiner axis and spaced apart from the first beam, the second beam, and the third beam; and wherein the beams cooperate to encircle the combiner axis.

23. The method of claim 17 further comprising the steps of (i) emitting a third beam with a third laser source; (ii) emitting a fourth beam with a fourth laser source; (iii) emitting a fifth beam with a fifth laser source; (iv) emitting a fifth beam with a fifth laser source; (v) emitting a sixth beam with a sixth laser source; (vi) emitting a seventh beam with a seventh laser source; (vii) reflecting and directing the third beam with a pair of spaced apart third beam directors which are independently adjustable so that the third beam is approximately parallel to and spaced apart from the combiner axis; (viii) reflecting and directing the fourth beam with a pair of spaced apart fourth beam directors which are independently adjustable so that the fourth beam is approximately parallel to and spaced apart from the combiner axis; (ix) reflecting and directing the fifth beam with a pair of spaced apart fifth beam directors which are independently adjustable so that the fifth beam is approximately parallel to and spaced apart from the combiner axis; (x) reflecting and directing the sixth beam with a pair of spaced apart sixth beam directors which are independently adjustable so that the sixth beam is approximately parallel to and spaced apart from the combiner axis; and (xi) reflecting and directing the seventh beam with a pair of spaced apart seventh beam directors which are independently adjustable so that the seventh beam is approximately parallel to and spaced apart from the combiner axis; wherein, the first beam is coaxial with the combiner axis, wherein the second beam, the third beam, the fourth beam, the fifth beam, the sixth beam, and the seventh beam cooperate to encircle the combiner axis; wherein the second, third, fourth, fifth, sixth and seventh beams are substantially equally spaced from the combiner axis; and wherein the second, third, fourth, fifth, sixth, and seventh beams are substantially equally spaced and positioned about a circle that is substantially coaxial with the combiner axis.

24. The method of claim 23 further comprising the steps of emitting an eighth beam with an eighth laser source, and reflecting the eighth beam with a dichroic filter so that the eighth beam is approximately parallel to the combiner axis and substantially coaxial with the first beam, the dichroic filter transmitting the first beam.

25. The method of claim 17 wherein the first beam is at a first wavelength and the second beam is at a second wavelength, and wherein the first wavelength is approximately equal to the second wavelength.

26. The method of claim 17 wherein the first beam is at a first wavelength and the second beam is at a second wavelength, and wherein the first wavelength is different than the second wavelength.

27. A laser source assembly for providing an assembly output beam along a combiner axis, the laser source assembly comprising:
   a first laser source that emits a first beam;
   a first temperature controller that controls the temperature of the first laser source;
   a second laser source that emits a second beam;
   a second temperature controller that controls the temperature of the second laser source; and
   a beam combiner that includes (i) a first beam director assembly that reflects and redirects the first beam so that the first beam is approximately parallel to the combiner axis, (ii) a second beam director assembly that reflects and redirects the second beam so that the second beam is approximately parallel to and spaced apart from the first beam, and (iii) a combiner lens positioned on the combiner axis in the path of the first beam and the second beam, the combiner lens focusing the beams to provide the assembly output beam.

28. The laser source assembly of claim 27 (i) wherein the first laser source includes a first QC gain media that generates the first beam in the MIR range, and a first WD feedback assembly that can be tuned to select the desired wavelength of the first beam, and (ii) wherein the second laser source includes a second QC gain media that generates the second beam in the MIR range, and a second WD feedback assembly.

29. The laser source assembly of claim 28 (i) wherein the first laser source includes a rigid, first mounting base that retains the first QC gain media and the first WD feedback assembly, the first mounting base transferring heat away from the first QC gain media to the first temperature controller; and (ii) wherein the second laser source includes a rigid, second mounting base that retains the second QC gain media and the second WD feedback assembly, the second mounting base transferring heat away from the second QC gain media to the second temperature controller.

30. The laser source assembly of claim 29 (i) wherein the first laser source includes a first cavity optical assembly positioned between the first QC gain media and the first feedback assembly, the first cavity optical assembly being secured to the first mounting base; and (ii) wherein the second laser source includes a second cavity optical assembly positioned between the second QC gain media and the second feedback assembly, the second cavity optical assembly being secured to the second mounting base.

31. The laser source assembly of claim 27 wherein (i) the first beam director assembly includes a pair of spaced apart first beam directors that are independently adjustable to reflect and redirect the first beam so that the first beam is approximately parallel to the combiner axis, and (ii) the second beam director assembly includes a pair of spaced apart second beam directors that are independently adjustable to reflect and redirect the second beam so that the second beam is approximately parallel to and spaced apart from the first beam.

32. The laser source assembly of claim 31 wherein each beam director is independently adjustable about a first axis and about a second axis that is perpendicular to the first axis.

33. The laser source assembly of claim 27 wherein the first beam director assembly reflects the first beam, and the second beam director assembly reflects the second beam so that a distance between a center of the first beam and a center of the second beam is approximately equal to a diameter of the first beam.

34. A missile jamming system for jamming an incoming missile, the missile jamming system comprising the laser source assembly of claim 27 directing the output beam at the incoming missile.

35. A laser source assembly for providing an assembly output beam along a combiner axis, the laser source assembly comprising:
   a first laser source that emits a first beam;
   a second laser source that emits a second beam;
   a third laser source that emits a third beam;
   a fourth laser source that emits a fourth beam;
   a fifth laser source that emits a fifth beam;
   a sixth laser source that emits a sixth beam;
   a seventh laser source that emits a seventh beam; and
   a beam combiner that includes (i) a first beam director assembly that redirects the first beam so that the first beam is coaxial with the combiner axis; (ii) a second beam director assembly that redirects the second beam so that the second beam is approximately parallel to and spaced apart from the combiner axis; (iii) a third beam director assembly that redirects the third beam so that the third beam is parallel to and spaced apart from the combiner axis; (iv) a fourth beam director assembly that redirects the fourth beam so that the fourth beam is approximately parallel to and spaced apart from the combiner axis; (v) a fifth beam director assembly that redirects the fifth beam so that the fifth beam is approximately parallel to and spaced apart from the combiner axis; (vi) a sixth beam director assembly that redirects the sixth beam so that the sixth beam is approximately parallel to and spaced apart from the combiner axis; and (vii) a seventh beam director assembly that redirects the seventh beam so that the seventh beam is approximately parallel to and spaced apart from the combiner axis; wherein the second, third, fourth, fifth, sixth and seventh beams are substantially equally spaced from the combiner axis; and wherein the second, third, fourth, fifth, sixth, and seventh beams are substantially equally spaced and positioned about a circle that is substantially coaxial with the combiner axis.

36. The laser source assembly of claim 35 further comprising an eighth laser source that emits an eighth beam, and a dichroic filter that reflects the eighth beam so that the eighth beam is approximately parallel to the combiner axis and substantially coaxial with the first beam, the dichroic filter transmitting the first beam.

37. The laser source assembly of claim 36 wherein (i) the first beam has a center wavelength in the MIR range; (ii) the second beam has a center wavelength in the MIR range; (iii) the third beam has a center wavelength in the MIR range; (iv) the fourth beam has a center wavelength in the MIR range; (v) the fifth beam has a center wavelength in the MIR range; (vi) the sixth beam has a center wavelength in the MIR range; (vii) the seventh beam has a center wavelength in the MIR range; and (viii) the eight beam has a center wavelength that is outside the MIR range.

38. The laser source assembly of claim 37 wherein (i) the first beam director assembly includes a pair of spaced apart first beam directors that are independently adjustable to reflect and redirect the first beam; (ii) the second beam director assembly includes a pair of spaced apart second beam directors that are independently adjustable to reflect and redirect the second beam; (iii) the third beam director assembly includes a pair of spaced apart third beam directors that are independently adjustable to reflect and redirect the third beam; (iv) the fourth beam director assembly includes a pair of spaced apart fourth beam directors that are independently adjustable to reflect and redirect the fourth beam; (v) the fifth beam director assembly includes a pair of spaced apart fifth beam directors that are independently adjustable to reflect and redirect the fifth beam; (vi) the sixth beam director assembly includes a pair of spaced apart sixth beam directors that are independently adjustable to reflect and redirect the sixth beam; and (vii) the seventh beam director assembly includes a pair of spaced apart seventh directors that are independently adjustable to reflect and redirect the seventh beam.

39. The laser source assembly of claim 38 wherein each beam director is independently adjustable about a first axis and about a second axis that is perpendicular to the first axis.

40. A missile jamming system for jamming an incoming missile, the missile jamming system comprising the laser source assembly of claim 35 directing the output beam at the incoming missile.

* * * * *